United States Patent
Kawai et al.

[11] Patent Number: 5,994,963
[45] Date of Patent: Nov. 30, 1999

[54] AMPLIFIER CIRCUIT AND MULTISTAGE AMPLIFIER CIRCUIT

[75] Inventors: Takahisa Kawai; Itsuo Okamoto, both of Kawasaki, Japan

[73] Assignee: Fujitsu Limited, Kawasaki

[21] Appl. No.: 08/804,042

[22] Filed: Feb. 24, 1997

[30] Foreign Application Priority Data

Jul. 12, 1996 [JP] Japan ................................ 8-182915

[51] Int. Cl.⁶ .................................................. H03F 3/16
[52] U.S. Cl. ........................ 330/277; 330/296; 330/310
[58] Field of Search .................... 330/277, 296, 330/310, 311

[56] References Cited

U.S. PATENT DOCUMENTS

| | | | |
|---|---|---|---|
| 4,672,327 | 6/1987 | Wittlinger | 330/227 X |
| 4,686,387 | 8/1987 | Rumelhard | 330/296 X |
| 4,881,046 | 11/1989 | Tung | 330/277 |
| 4,943,785 | 7/1990 | Benz et al. | 330/277 |

*Primary Examiner*—Steven J. Mottola
*Attorney, Agent, or Firm*—Armstrong, Westerman, Hattori, McLeland & Naughton

[57] ABSTRACT

An amplifier circuit includes a first FET of an enhancement type having a gate supplied with an input signal and a gate bias voltage and a drain via which an amplified output signal is output, and a second FET of the enhancement type having a drain connected to a drain voltage source, a source connected to the drain of the first FET, and a gate supplied with a control signal for controlling the drain voltage supplied to the first FET.

41 Claims, 15 Drawing Sheets

AMPLIFIER CIRCUIT AND MULTISTAGE AMPLIFIER CIRCUIT

BACKGROUND OF THE INVENTION

1. Field of the Invention

The present invention relates to amplifier circuits which employ field effect transistors (FETs).

2. Description of the Related Art

FIG. 1 is a block diagram of a part of a conventional portable telephone set. The portable telephone set includes an input/output circuit part 1, a baseband circuit part 2, a high-frequency circuit part 3, an antenna 4 and a power supply part 5.

The input/output circuit part 1 includes a keyboard, a display part, a microphone and a speaker. The baseband circuit part 2 converts an analog voice signal supplied from the microphone of the input/output circuit part 1 into a digital signal. Then, the baseband circuit part 2 performs voice coding, channel coding, scrambling, and digital modulating processes. Finally, the baseband circuit part 2 converts the processed digital signal into an analog signal, which is supplied to the high-frequency circuit part 3. Further, the baseband circuit 2 converts an analog signal supplied from the high-frequency circuit part 3 into a digital signal. Then, the baseband circuit 2 performs digital demodulating, descrambling, channel decoding and voice decoding operations. Then, the baseband circuit part 2 supplies the resultant analog voice signal to the speaker of the input/output circuit part 1.

The high-frequency circuit part 3 modulates the analog signal from the baseband circuit part 2 and performs a power amplifying operation on the modulated signal. Also, the high-frequency circuit part 3 amplifies a signal received via the antenna 4 and demodulates the amplified signal. The power supply part 5 supplies electricity to the input/output circuit part 1, the baseband circuit part 2 and the high-frequency circuit part 3.

FIG. 2 is a circuit diagram of the configuration of the high-frequency circuit part 3. The high-frequency circuit part 3 includes a transmit circuit part 7, a receive circuit part 8 and a switch circuit 9. The switch circuit 9 connects an output terminal 7A of the transmit circuit part 7 to the antenna 4 at the time of transmitting a signal, and connects an input terminal 8A of the receive circuit part 8 to the antenna at the time of receiving a signal.

The transmit circuit part 7 includes a modulator 10, a voltage-controlled oscillator (VCO) 11, a multiplier 12, an amplifier 13, a surface acoustic wave (SAW) filter 14, and a power amplifier 15. The modulator 10 modulates the signal supplied from the baseband circuit part 2. The VCO 11 generates a signal necessary to perform an up conversion of the signal output by the modulator 10. The multiplier 12 multiplies the signal from the modulator 10 by the signal from the VCO 11 so that the modulated signal is changed to a high-frequency signal. The amplifier 13 amplifies the high-frequency signal output from the multiplier 12. The SAW filter 14 functions as a band-pass filter and filters the amplified high-frequency signal. The power amplifier 15 performs a power amplifying operation on the amplified high-frequency signal.

The receive circuit part 8 includes an amplifier 16, a SAW filter 17, a VCO 18, an amplifier 19, a multiplier 20 and a demodulator 21. The amplifier 16 amplifies the signal received via the antenna 4. The SAW filter 17 functions as a bandpass filter and filters the amplified received signal. The VCO 18 generates a signal necessary to perform a down conversion on the signal from the SAW filter 17. The amplifier 19 amplifies the signal output by the VCO 18. The multiplier multiplies the signal from the SAW filter 17 by the amplified signal from the amplifier 19 so that the baseband signal of the received signal can be retrieved. The demodulator 10 demodulates the output signal of the multiplier 20 and reproduces the original signal.

FIG. 3 is a circuit diagram of the power amplifier 15. The power amplifier 15 is formed in a monolithic microwave integrated circuit (MMIC) formation, and is comprised of two amplifier circuits 24 and 25, an input terminal 23 and an output terminal 26. An input signal IN is applied to the input terminal 23, and an output signal OUT is output via the output terminal 26.

The amplifier circuit 24 includes a depletion type Shottky gate field effect transistor (so called D-type MESFET) 27, which functions as an amplifying element, and a capacitance element (capacitor) 28 preventing a DC component from being applied to the amplifier circuit 25. The amplifier circuit 24 includes a drain voltage input terminal 29 supplied with a positive drain voltage VDD1 from a drain voltage source. The voltage VDD1 is equal to, for example, +4 V. The amplifier circuit 24 includes a gate bias circuit 30, which supplies the gate of the D-type MESFET 27 with a negative gate bias voltage VGB1 equal to, for example, −1.5 V. The amplifier circuit 24 includes a gate bias source voltage input terminal 31 supplied with a negative gate bias source voltage VGG1 from a gate bias source. The voltage VGG1 is equal to, for example, −4.0 V. The amplifier circuit 24 includes resistors 32 and 33, which divide the gate bias source voltage VGG1 to thereby generate a gate bias voltage VGB1.

The amplifier circuit 25 includes a D-type MESFET 34, which functions as an amplifying element, and a capacitance element (capacitor) 35 preventing a DC component from being applied to the output terminal 26. The amplifier circuit 25 includes a drain voltage input terminal 36 supplied with a positive drain voltage VDD2 supplied from a drain voltage source. The voltage VDD2 is equal to, for example, +5.8 V. The amplifier circuit 25 includes a gate bias circuit 37, which supplies the gate of the D-type MESFET 34 with a negative gate bias source voltage VGG2 equal to, for example, −4.0 V. The amplifier circuit 25 includes resistors 39 and 40, which divide the gate bias source voltage VGG2 to thereby generate a gate bias voltage VGB2.

The portable telephone set as described above employs the power amplifier 15 of the transmit circuit part 7 of the high frequency circuit part 3, the power amplifier 15 using the D-type MESFETs 27 and 34. This structure requires the positive power sources respectively functioning as the drain voltage sources for the D-type MESFETs 27 and 34 and the negative power sources respectively functioning as the gate bias sources for the D-type MESFETs 27 and 34. In practice, a DC-DC converter is used to realize the positive and negative power sources. This increases the production cost and prevents down sizing.

SUMMARY OF THE INVENTION

It is a general object of the present invention to eliminate the above disadvantages.

A more specific object of the present invention is to provide an amplifier circuit and a multistage amplifier circuit which requires only a positive power source and does not require any negative power source.

The above objects of the present invention are realized by an amplifier circuit comprising: a first FET of an enhancement type having a gate supplied with an input signal and a gate bias voltage and a drain via which an amplified output signal is output; and a second FET of the enhancement type having a drain connected to a drain voltage source, a source connected to the drain of the first FET, and a gate supplied with a control signal for controlling the drain voltage supplied to the first FET. According to the above amplifier circuit, the first and second FETs are of the enhancement type in which the drain voltage and the control signals (voltages) are positive voltages. This requires only a positive power source, and does not require a negative power source.

It is possible to vary the drain voltage of the first FET and thus control the gain of the amplifier circuit by varying the level of the control signal in an active state.

It may be possible to omit the second FET without the second FET in which the gain of the amplifier circuit can be varied by varying the gate bias voltage of the first FET. However, in this case, it will be impossible to obtain a large variable range for controlling the gain if the input signal has a large amplitude or the first FET does not have a high threshold voltage so that the first FET cannot be set close to the OFF state even if the gate bias voltage of the first FET is decreased close to 0V. Hence, it is required to greatly attenuate the input signal, the above-discussed arrangement cannot provide such a large signal attenuation.

On the other hand, according to the above-mentioned invention, the second FET makes it possible to reduce the drain voltage of the first FET to 0 V or a level close thereto, so that a large variable range for controlling the gain can be realized and thus the input signal can be greatly attenuated.

The above amplifier circuit may be configured so that an increase and decrease in the gate bias voltage of the first FET is controlled. For example, if it is required to reduce the drain voltage of the first FET, the gate bias voltage of the first FET is reduced. Hence, a larger gain variable range can be realized.

The amplifier circuit may be configured so that the control signal supplied to the gate of the second FET is supplied to the gate of the first FET as the gate bias voltage of the first FET. Hence, it is possible to simplify the gate bias circuit which supplies the gate bias voltages to the first and second FETs.

The amplifier circuit may be configured so that the gate bias voltage of the first FET is a voltage obtained by dividing the control signal by resistors. It is possible to obtain a lower limit of the gate voltage of the first FET close to 0 V even if the lower limit of the control signal cannot be set to 0 V. Thus, it becomes possible to further increase the variable gain range.

The amplifier circuit may be configured so that the gate of the second FET is supplied with the control signal via a resistor. Hence, it is possible to further decrease the gate voltage of the second FET, so that the drain voltage of the first FET can more easily be set to 0 V or a voltage close thereto.

The amplifier circuit may be configured so that the source of the second FET is connected to the drain of the first FET via an inductance element. It is possible to prevent the signal amplified by the first FET from being transferred to the drain voltage source via the second FET and thus efficiently transfer the signal amplified by the first FET to the next-stage circuit.

The amplifier circuit may be configured so that the source of the second FET is grounded via a capacitance element. This capacitance element functions to cause signals having frequencies lower than the frequency of the signal to be amplified by the first FET as well as noise from the drain voltage source to flow to the ground. Hence, these unwanted components cannot be transferred to the next-stage circuit.

The amplifier circuit may be configured so that the source of the second FET is connected to the drain of the first FET via a parallel resonance circuit which resonates at a frequency of a signal to be amplified by the first FET. The parallel resonance circuit prevents signals other than the signal to be amplified by the first FET from being transferred to the next-stage circuit. Hence, the selectivity can be improved.

The amplifier circuit may further comprise a third FET of the enhancement type having a drain connected to the gate bias source for the first FET, a gate supplied with the control signal, and a source, wherein a source voltage obtained at the source of the third FET is supplied to the gate of the first FET as the gate bias voltage of the first FET. The third FET makes it possible to obtain the lower limit of the first FET close to 0 V even if the lower limit of the control signal cannot be set equal to 0 V.

The amplifier circuit may be configured so that the gate bias voltage of the first FET is a voltage obtained by dividing the source voltage of the third FET by resistors. It is possible to obtain the lower limit of the gate voltage of the first FET closer to 0 V even if the lower limit of the control signal cannot be set equal to 0 V.

The amplifier circuit may be configured so that the gate of the second FET is supplied with the control signal via a resistor.

The amplifier circuit may be configured so that it further comprises a third FET of the enhancement type having a drain connected to the gate bias source for the first FET, a gate supplied with the control signal, and a source, wherein a source voltage obtained at the source of the third FET is supplied to the gate of the first FET and the gate of the second FET. The third FET makes it possible to obtain the lower limit of the first FET close to 0 V even if the lower limit of the control signal cannot be set equal to 0 V.

The amplifier circuit may be configured so that the gate bias voltage of the first FET is a voltage obtained by dividing the source voltage of the third FET by resistors.

The amplifier circuit may be configured so that the source voltage of the third FET is supplied to the gate of the second FET via a resistor.

The above-mentioned objects of the present invention are also achieved by an amplifier circuit comprising: a first FET of an enhancement type having a gate supplied with an input signal and a gate bias voltage, and a drain via which an amplified output signal is output, a current path directed to a source from the gate being formed; a second FET of the enhancement type having a drain connected to a gate bias supply source for the first FET, a gate supplied with a control signal, and a source via which a source voltage controlled by the control signal is output, the source voltage being supplied to the gate of the first FET as the gate bias voltage; and a resistance element having a first end connected to the source of the second FET and the gate of the first FET, and a second end grounded. According to the above amplifier circuit, the first and second FETs are of the enhancement type in which the drain voltage and the control voltages are positive voltages. This requires only a positive power source, and does not require a negative power source.

It is possible to vary the gate bias voltage of the first FET and thus control the gain of the amplifier circuit by varying the level of the control signal in an active state.

It may be possible to omit the second FET and configure the amplifier circuit so that the control signal is supplied, as the gate bias voltage, to the gate of the first FET. In this case, it is desired to reduce the resistance value of the resistance element in order to cause a current much greater than the current flowing in the gate of the first FET to flow in the resistance element because the gate voltage is decreased and the output level is thus reduced if a large current flows to the gate of the first FET. However, the above case increases power consumption in the inactive state.

According to the present invention having the above structure, the second FET is provided with the gate supplied with the control signal. Hence it is possible to reduce the current flowing in the resistance element and set the gate bias voltage of the first FET close to 0 V due to the function of the second FET even if the current flowing in the resistance element is increased in the active state in order to prevent a decrease in the gate bias voltage of the first FET or the control signal cannot be set to 0 V in the inactive state. As a result, the drain current of the first FET can be reduced and thus power consumption can be reduced.

The amplifier circuit may be configured so that the gate of the first FET is supplied, as the gate bias voltage, with a voltage obtained by dividing the source voltage of the second FET by resistors. It is thus possible to set the gate bias voltage of the first FET closer to 0 V and further reduce power consumption.

The above-mentioned objects of the present invention are also achieved by a multistage amplifier circuit comprising: a first-stage amplifier circuit including a first FET of an enhancement type having a gate supplied with an input signal and a gate bias voltage, and a drain via which an amplified output signal is output, and a second FET of the enhancement type having a drain connected to a drain voltage source, a source connected to the drain of the first FET and a gate supplied with a control signal for controlling a drain voltage supplied to the first FET; and a second-stage amplifier circuit amplifying an output signal of the first-stage amplifier circuit. The first-stage amplifier circuit uses only the FETs of the enhancement type. If the second-stage amplifier circuit uses only FETs of the enhancement type, the drain voltages and the control signals are positive voltages. Hence, the multistage amplifier circuit needs a positive power source only, and does not need a negative power source.

Further, the gain of the amplifier circuit can be controlled by varying the level of the control signal and thus varying the drain voltage of the first FET.

It may be possible to configure the first-stage amplifier circuit without the second FET. In this case, the gate bias voltage of the first FET is varied so that the gain of the amplifier circuit can be controlled. However, it is impossible to obtain a large variable gain range if the input signal is still large even by reducing the gate bias voltage of the first FET close to 0 V or the threshold voltage of the first FET cannot be increased and the first FET cannot be set to a state near the OFF state. Hence, the input signal cannot be attenuated greatly in the first-stage amplifier circuit.

In this regard, according to the present invention configured as described above, the second FET functions to reduce the drain voltage of the first FET to 0 V or a level close thereto. Hence, the first-stage amplifier circuit has a large variable gain range and is able to greatly attenuate the input signal in the first-stage amplifier.

The multistage amplifier circuit may further comprise a capacitance element provided between the first-stage amplifier circuit and the second-stage amplifier circuit.

The multistage amplifier circuit may be configured so that another control signal for controlling a gain of the second-stage amplifier circuit is applied to the second-stage amplifier circuit.

The multistage amplifier circuit may be configured so that the control signal supplied to the gate of the second FET and the above-discussed other control signal are provided as a common signal.

The multistage amplifier circuit may further comprise an impedance element provided between the gate of the second FET and an input terminal of the second-stage amplifier circuit to which the common signal is applied.

The multistage amplifier circuit may further comprise an inductance element connecting the source of the second FET to the drain of the first FET.

The multistage amplifier circuit may further comprise a capacitance element grounding the source of the second FET.

The multistage amplifier may further comprise a parallel resonance circuit which resonates at a frequency of a signal to be amplified by the first FET, the parallel resonance circuit being provided between the source of the second FET and the drain of the first FET.

The aforementioned objects of the present invention are also achieved by a multistage amplifier circuit comprising: a first-stage amplifier circuit amplifying an input signal; and a second-stage amplifier circuit including a first FET of an enhancement type having a gate supplied with an input signal and a gate bias voltage, and a drain via which an amplified output signal is output, a current path directed to a source from the gate being formed; a second FET of the enhancement type having a drain connected to a gate bias supply source for the first FET, a gate supplied with a control signal, and a source via which a source voltage controlled by the control signal is output, the source voltage being supplied to the gate of the first FET as the gate bias voltage; and a resistance element having a first end connected to the source of the second FET and the gate of the first FET, and a second end grounded.

The second-stage amplifier circuit of the amplifier circuit uses the enhancement-type FETs only. Hence, if the first-stage amplifier circuit is formed by enhancement-type FETs only, the drain voltages and the control signals are positive voltages, which can be generated by a positive voltage source. That is, a negative voltage source is not required.

It may be possible to configure the second-stage amplifier circuit without the second FET so that the control signal is supplied, as the gate bias signal, to the gate of the first FET. However, in this case, it is desired to reduce the resistance value of the resistance element in order to cause a current much greater than the current flowing in the gate of the first FET to flow in the resistance element because the gate voltage is decreased and the output level is thus reduced if a large current flows to the gate of the first FET. However, the above case increases power consumption in the inactive state.

According to the present invention having the above structure, there is provided the second FET with the gate supplied with the control signal. Hence it is possible to reduce the current flowing in the resistance element and set the gate bias voltage of the first FET close to 0 V due to the function of the second FET even if the current flowing in the resistance element is increased in the active state in order to prevent a decrease in the gate bias voltage o the first FET or the control signal cannot be set to 0 V in the inactive state. As a result, the drain current of the first FET can be reduced and thus power consumption can be reduced.

The multistage amplifier may further comprise a capacitance element provided between the first-stage amplifier circuit and the second-stage amplifier circuit.

The multistage amplifier may be configured so that another control signal for controlling a gain of the second-stage amplifier circuit is applied to the second-stage amplifier circuit.

The multistage amplifier circuit may be configured so that the control signal supplied to the gate of the second FET and the above-discussed other control signal are provided as a common signal.

The multistage amplifier circuit may further comprise an impedance element provided between the gate of the second FET and an input terminal of the second-stage amplifier circuit to which the common signal is applied.

The aforementioned objects of the present invention are also achieved by a multistage amplifier circuit comprising: a first-stage amplifier circuit including a first FET of an enhancement type having a gate supplied with an input signal and a first gate bias voltage, and a drain via which a first amplified output signal is output, and a second FET of the enhancement type having a drain connected to a first drain voltage source, a source connected to the drain of the first FET and a gate supplied with a first control signal for controlling a first drain voltage supplied to the first FET; and a second-stage amplifier circuit including a third FET of the enhancement type having a gate supplied with the first amplified output signal from the first-stage amplifier circuit and a first gate bias voltage, and a drain via which a second amplified output signal is output, a current path directed to a source from the gate being formed; a fourth FET of the enhancement type having a drain connected to a second gate bias supply source for the third FET, a gate supplied with a second control signal, and a source via which a source voltage controlled by the second control signal is output, the source voltage being supplied to the gate of the first FET as the first gate bias voltage; and a resistance element having a first end connected to the source of the second FET and the gate of the first FET, and a second end grounded. The above multistage amplifier circuit has features and advantages as described above.

The multistage amplifier circuit may further comprise a capacitance element provided between the first-stage amplifier circuit and the second-stage amplifier circuit.

The multistage amplifier circuit may be configured so that the first control signal supplied to the gate of the second FET and the second control signal are provided as a common signal.

The multistage amplifier circuit may further comprise an impedance element provided between the gate of the second FET and the gate of the fourth FET.

The multistage amplifier circuit may further comprise an inductance element connecting the source of the second FET to the drain of the first FET.

The multistage amplifier circuit may further comprise a capacitance element grounding the source of the second FET.

The multistage amplifier circuit may further comprise a parallel resonance circuit which resonates at a frequency of a signal to be amplified by the first FET, the parallel resonance circuit being connected between the source of the second FET and the drain of the first FET.

In the above amplifier circuits, the first and second FETs can be MESFETs using, for example, compound semiconductor elements.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
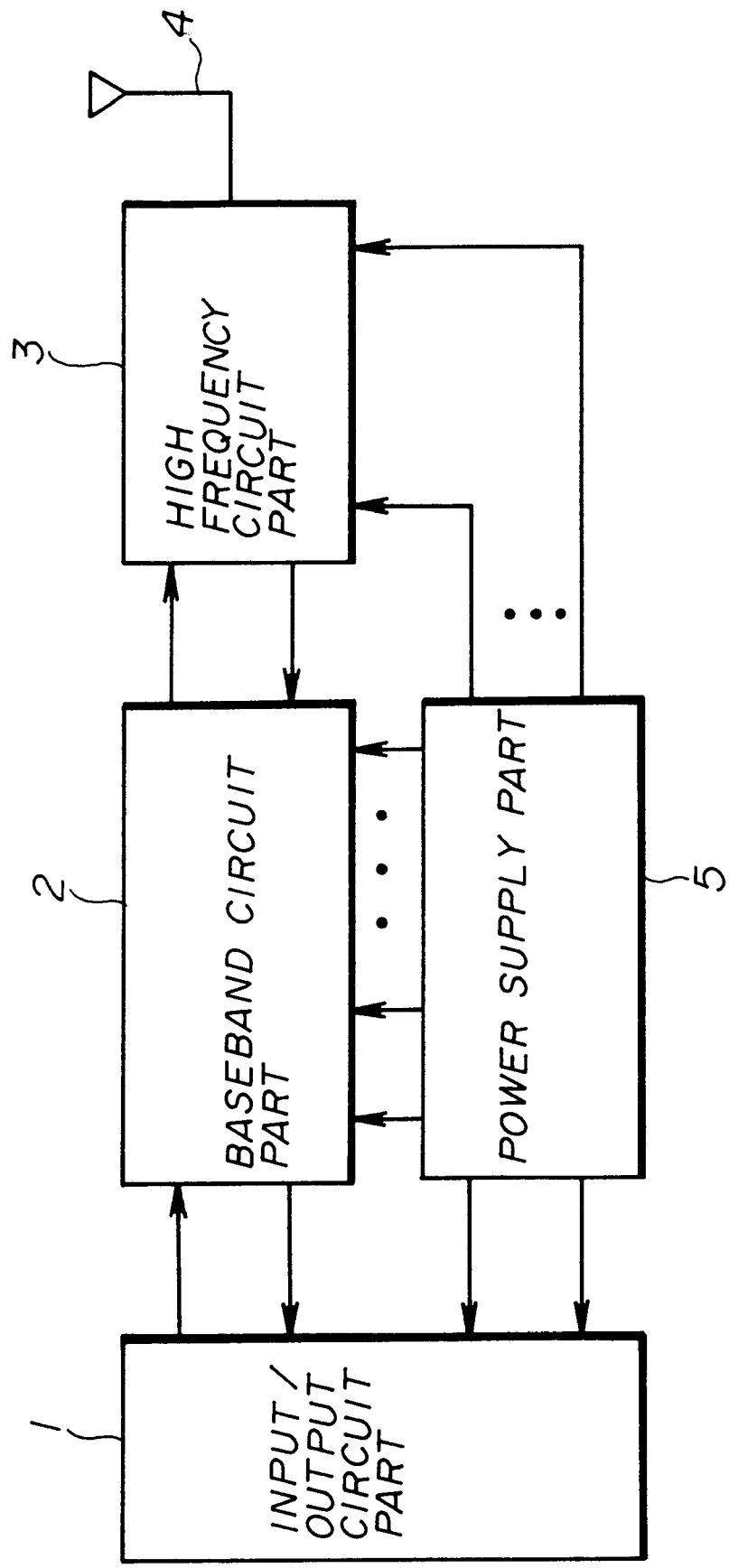
FIG. 1 is a block diagram of an essential part of a conventional portable telephone set.
Figure 2:
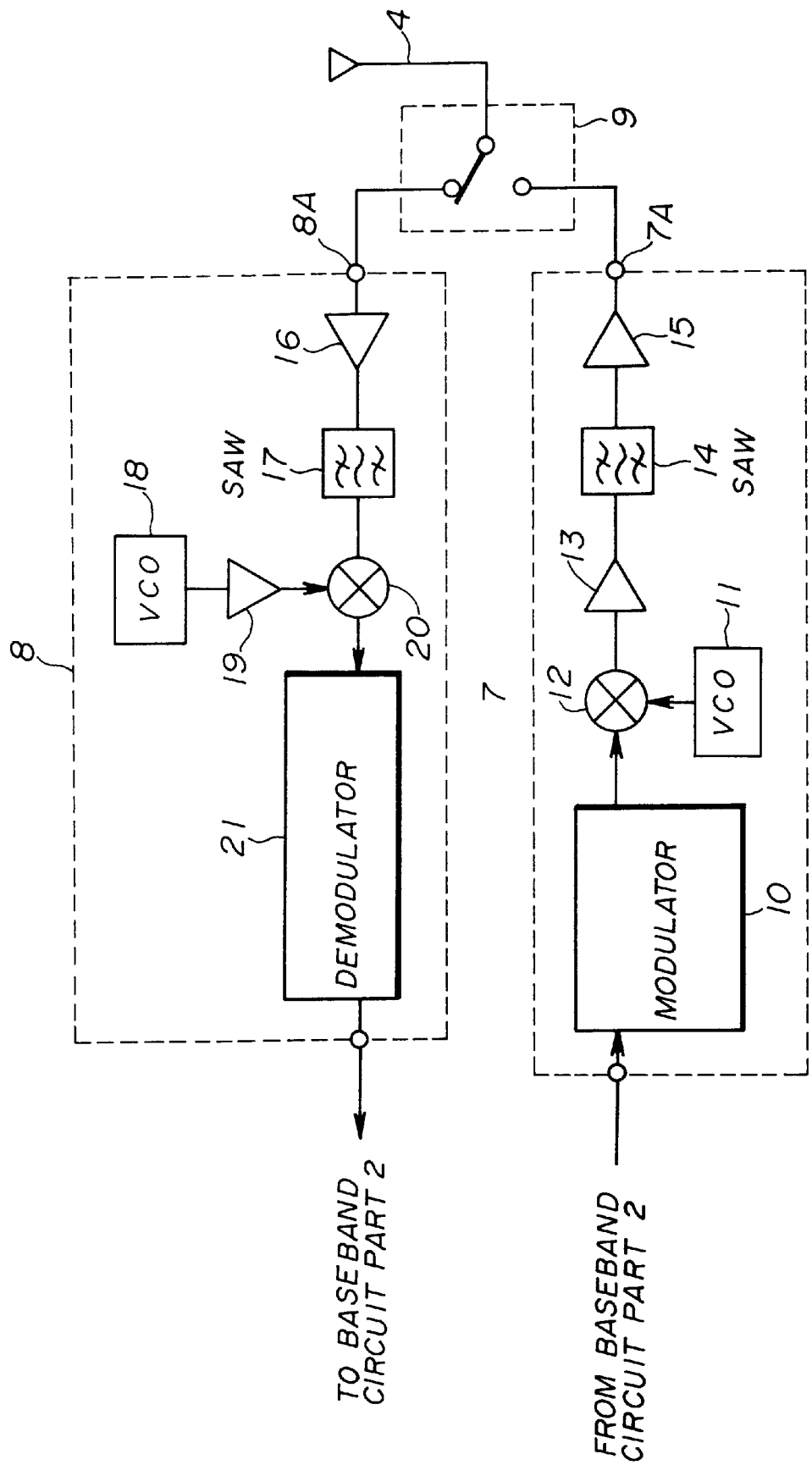
FIG. 2 is a circuit diagram of a high frequency circuit part shown in FIG. 1.
Figure 3:
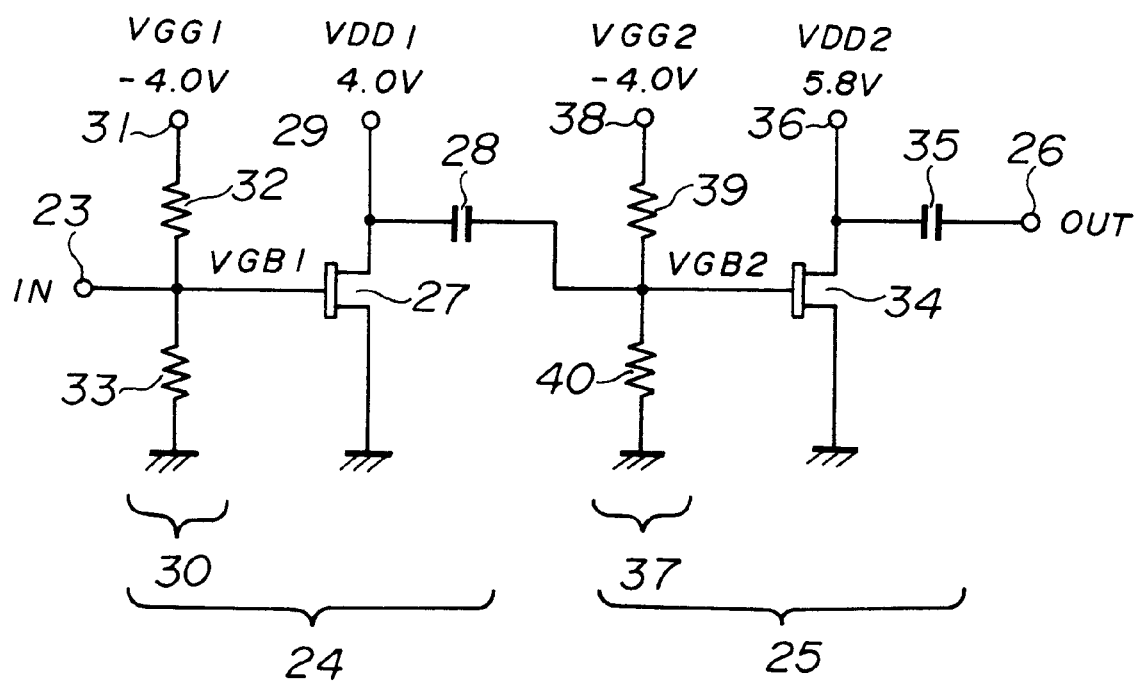
FIG. 3 is a circuit diagram of a power amplifier shown in FIG. 1.
Figure 4:
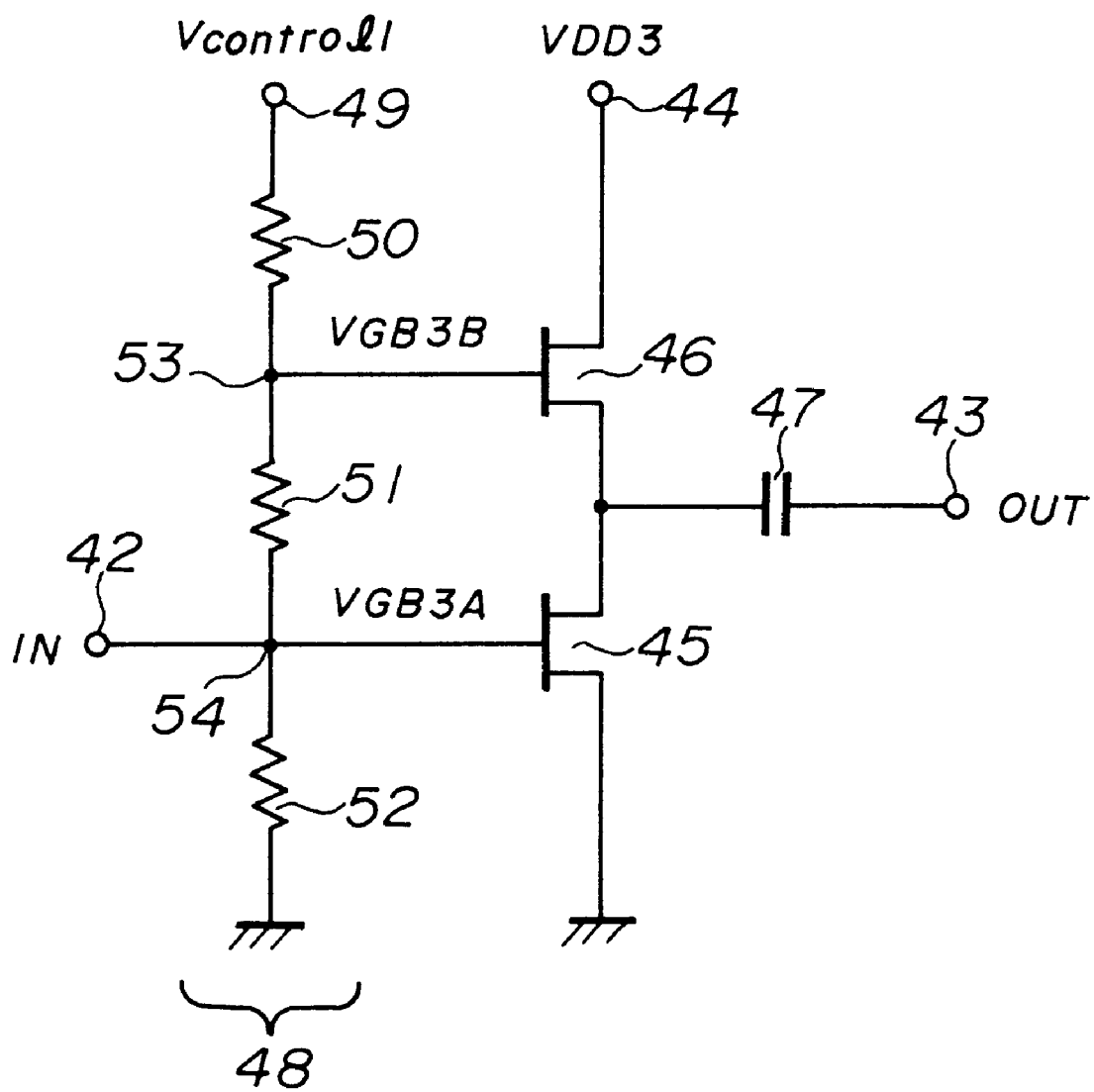
FIG. 4 is a circuit diagram of an amplifier circuit according to a first embodiment of the present invention.

FIG. 4 is a circuit diagram of an amplifier circuit according to a first embodiment of the present invention. The amplifier circuit shown in FIG. 4 includes a signal input terminal 42, a signal output terminal 43, and a drain voltage input terminal 44. An input signal IN is applied to the signal input terminal 42. An output signal is output via the signal output terminal 43. A positive drain voltage VDD3 is applied to the drain voltage input terminal 44.

The amplifier circuit shown in FIG. 4 includes an enhancement-type Shottky field effect transistor (a so-called E-type MESFET) 45, which functions as an amplifying element. The amplifier circuit further includes an E-type MESFETs 46 which controls the drain voltage of the E-type MESFET 45, and a capacitance element (capacitor) 47 preventing a DC component from being applied to the output terminal 43. The gate of the E-type MESFET 45 is connected to the signal input terminal 42, and the drain thereof is connected to the source of the E-type MESFET 46 and to the signal output terminal 43 via the capacitance element 47. The source of the E-type MESFET 45 is grounded. The drain of the E-type MESFET 46 is connected to the drain voltage input terminal 44.

The amplifier circuit shown in FIG. 4 includes a gate bias circuit 48, which supplies gate bias voltages VGB3A and VGB3B to the gates of the E-type MESFETs 45 and 46, respectively. The amplifier circuit includes a gate bias control voltage input terminal 49, to which a variable positive gate bias control voltage $V_{control1}$ is applied as a control signal. The circuit 48 includes resistors 50, 51 and 52, which divide the gate bias control voltage $V_{control1}$ to thereby generate the gate bias voltages VGB3A and VGB3B.

The first embodiment of the present invention is on the assumption that the gate bias control voltage source which outputs the gate bias control voltage $V_{control1}$ is not capable of generating 0 V and the lower limit of the voltage $V_{control1}$ is equal to, for example, 0.2 V.

The resistors 50, 51 and 52 are connected in series between the gate bias control voltage input terminal 49 and the ground. A connection node 53 between the resistors 50 and 51 is connected to the gate of the E-type MESFET 46, and a connection node 54 between the resistors 51 and 52 is connected to the gate of the E-type MESFET 45.

The amplifier circuit thus configured according to the first embodiment of the present invention can control the gain by varying the gate bias control voltage $V_{control1}$ in an active state thereof. More particularly, for example, as the voltage value of the gate bias control voltage $V_{control1}$ is increased, the gate bias voltage VGB3B is increased, and the ON resistance of the E-type MESFET 46 is decreased. Further, the drain voltage of the E-type MESFET 45 is increased, and the gate bias voltage VGB3A is increased. Hence, the output level is increased.

As the voltage value of the gate bias control voltage $V_{control1}$ is decreased, the gate bias voltage VGB3B is decreased, and the ON resistance of the E-type MESFET 46 is increased. Further, the drain voltage of the E-type MESFET 45 is decreased, and the gate bias voltage VGB3A is decreased. Hence, the output level is decreased.

With the above in mind, the first embodiment of the present invention determines the value of the drain voltage VDD3, the characteristic of the E-type MESFET 46 and the resistance values of the resistors 50, 51 and 52 so that in response to a variation of the gate bias control voltage $V_{control1}$, the drain voltage of the E-type MESFET 45 is changed between 4 V and 0 V, and the gate bias voltage VGB3A is changed between 0.4 V and 0 V.

It will be noted that an amplifier circuit may be configured without the E-type MESFET 46. In this case, the gain can be controlled by varying the gate bias voltage VGB3A of the E-type MESFET 45. However, it is impossible to increase the threshold voltage of the E-type MESFET 45. Hence, even if the gate bias voltage VGB3A of the E-type MESFET 45 is decreased to approximately 0 V, it is impossible to set the E-type MESFET 45 to the OFF state or a state close thereto. Thus, a large variable gain range cannot be obtained. If there is a requirement to greatly attenuate the input signal IN, the above configuration cannot meet the requirement.

To the contrary, the first embodiment of the present invention is capable of realizing a large variable gain range and greatly attenuating the input signal IN. This is because the E-type MESFET 46 can vary the value of the gate bias control voltage $V_{control1}$ and thus vary the drain voltage of the E-type MESFET 45 so that the drain voltage of the E-type MESFET 45 can be decreased to 0 V.

Figure 5:
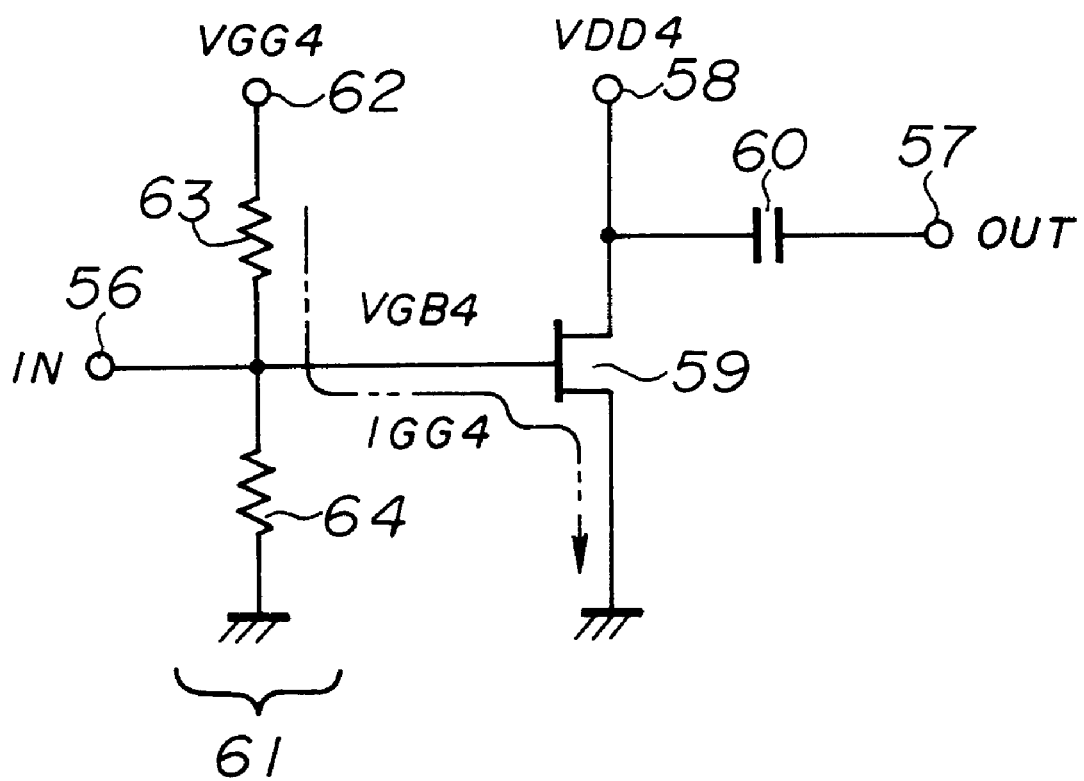
FIG. 5 is a circuit diagram explaining function and effects of the circuit shown in FIG. 4.

FIG. 5 is a diagram explaining the function and effects of the amplifier circuit according to the first embodiment of the present invention. In FIG. 5, a reference number 56 indicates a signal input terminal to which the input signal IN is applied. A reference number 57 indicates a signal output terminal via which the output signal OUT is output. A reference number 58 indicates a drain voltage input terminal to which a positive drain voltage VDD4 is applied. A reference number 59 indicates an E-type MESFET functioning as an amplifying element. A reference number 60 indicates a capacitance element which prevents a DC component from being applied to the signal output terminal 57.

A reference number 61 indicates a gate bias circuit, which supplies the gate of the E-type MESFET 59 with a gate bias voltage VGB4. A reference number 62 indicates a gate bias source voltage input terminal, to which a positive gate bias voltage VGG4 is input. Reference numbers 63 and 64 indicate resistors, which divide the gate bias source voltage VGG4 to thereby generate the gate bias voltage VGB4.

Figure 6:
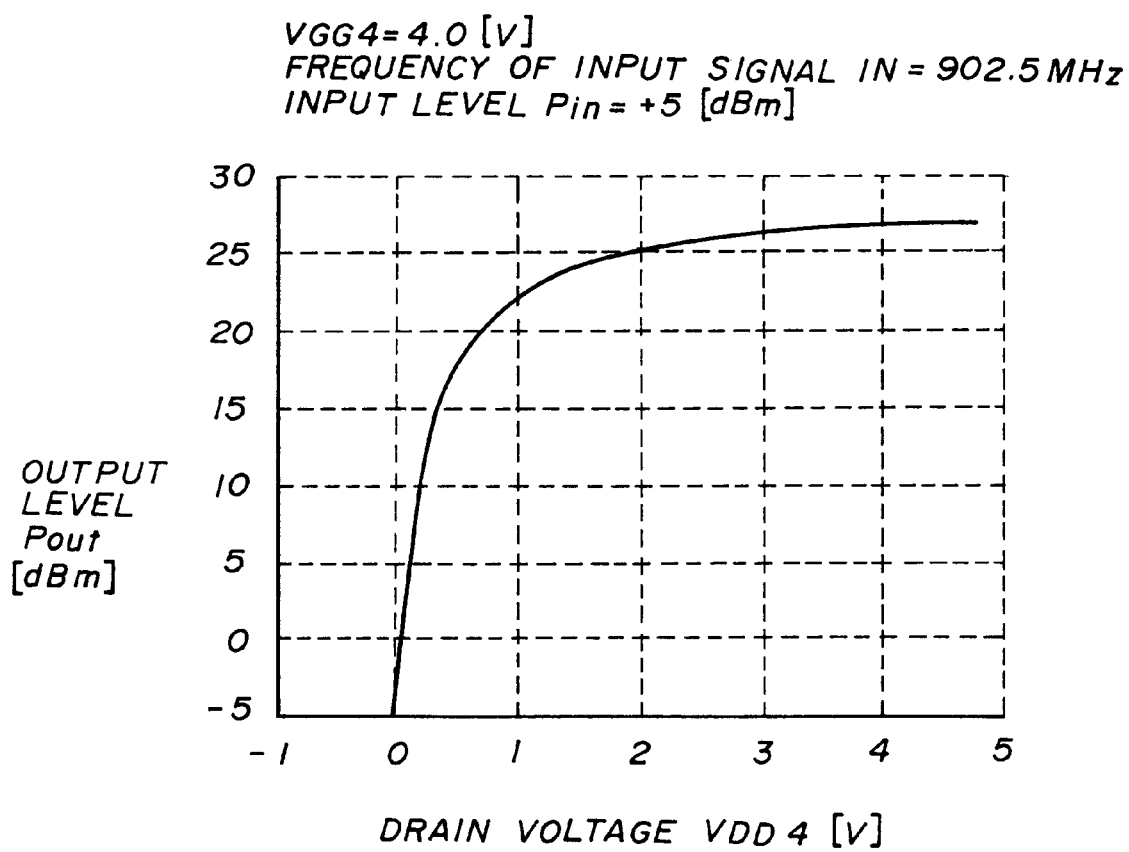
FIG. 6 is a graph of an output level vs drain voltage of the amplifier circuit shown in FIG. 5.

FIG. 6 is a graph of an output level (Pout) vs drain voltage (VDD4) characteristic obtained under the following conditions: VGG4=4.0 V, the frequency of the input signal is equal to 902.5 MHz, and the input level Pin thereof is equal to +5 dBm. It can be seen from FIG. 6 that the amplifier circuit shown in FIG. 5 has a characteristic in which the output level Pout can be changed by 30 dBc by varying the drain voltage VDD4 between 4 V and 0 V.

On the other hand, according to the first embodiment of the present invention, the drain voltage of the E-type MESFET 45 can be changed between 4 V and 0 V by varying the gate bias control voltage $V_{control1}$. Further, the output level Pout can be varied over 30 dBc because the gate bias voltage VGB3A can be changed in the range of 0.4 V to 0 V.

When the amplifier circuit according to the first embodiment of the present invention is made inactive, the gate bias control voltage $V_{control1}$ is decreased to the lower limit, and the drain voltage of the E-type MESFET 45 and the gate bias voltage VGB3A are fixed to 0 V. Thus, it is possible to prevent the drain current from flowing in the E-type MESFET 45 even if the input signal IN is applied to the gate thereof.

As described above, according to the first embodiment of the present invention, only positive voltages such as the drain voltage VDD3 and the gate bias control voltage $V_{control1}$, and any negative voltages are not needed, because only the E-type MESFET is used. Hence, it is necessary to provide only a positive power source, while a negative power source is not needed.

Further, it is possible to greatly attenuate the input signal IN by changing the drain voltage of the E-type MESFET 45 and the gate bias voltage VGB3A by changing the gate bias control voltage $V_{control1}$ in the active state. In the inactive state, it is possible to prevent the drain current from flowing in the E-type MESFET 45 by decreasing the gate bias control voltage $V_{control1}$ to the lower limit and then fixing the drain voltage of the E-type MESFET 45 and the gate bias voltage VGB3A to 0 V. Hence, it is not necessary to provide a switch element (switch module) directed to shutting the drain current between the drain voltage source and the drain voltage input terminal 44. As a result, power consumption can be reduced nevertheless and a switch element is not required.

It is possible to omit the resistor 50 provided between the gate bias control voltage input terminal 49 and the gate of the E-type MESFET 46.

Figure 7:
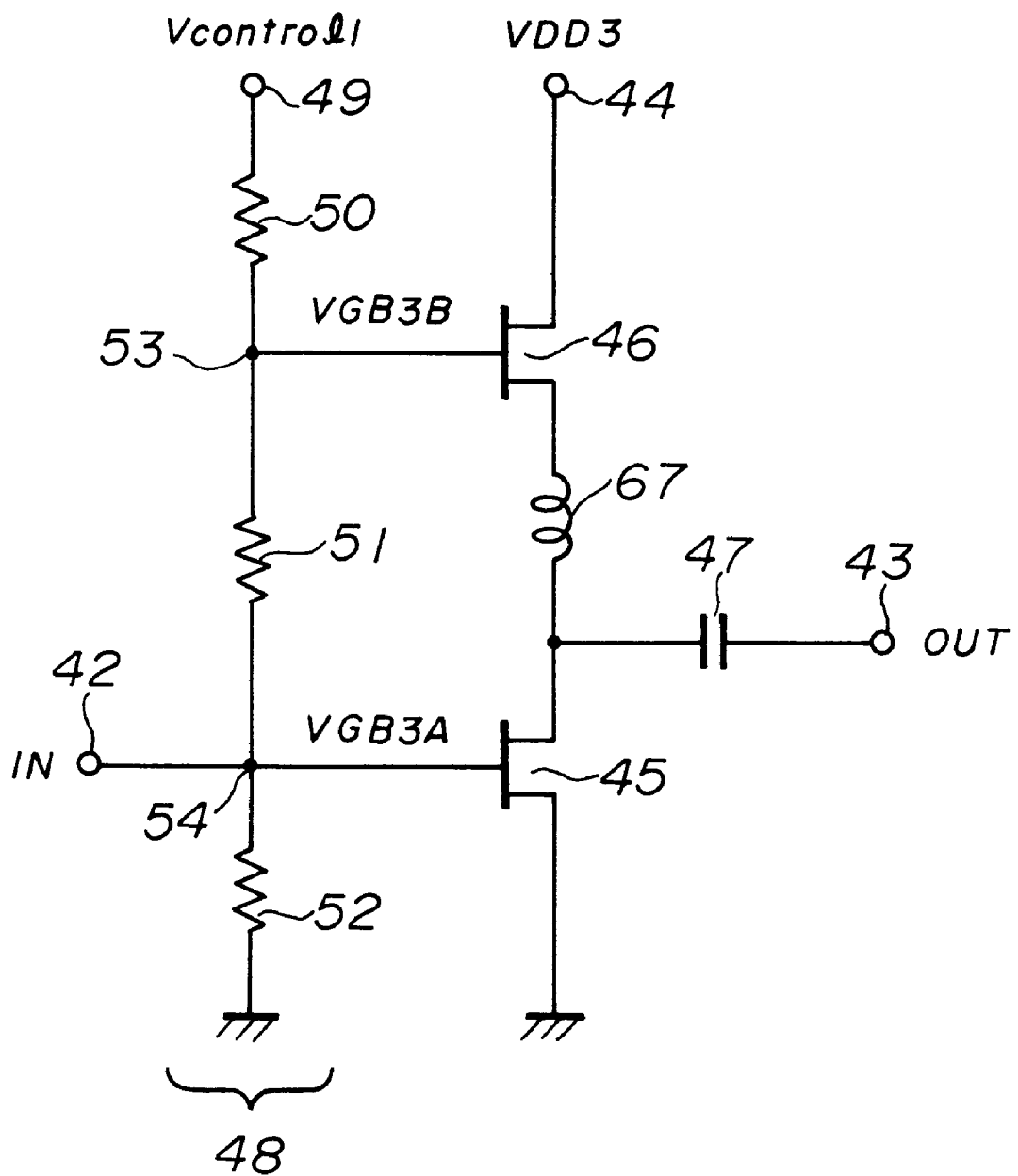
FIG. 7 is a circuit diagram of an amplifier circuit according to a second embodiment of the present invention.

A description will now be given, with reference to FIG. 7, of an amplifier circuit according to a second embodiment of the present invention. In FIG. 7, parts that are the same as those shown in the previously described figures are given the same reference numbers. In the amplifier circuit shown in FIG. 7, the source of the E-type MESFET 46 is coupled to the drain of the E-type MESFET 46 via an inductance element 67. The other portions of the amplifier circuit shown in FIG. 7 are the same as those of the amplifier circuit according to the first embodiment of the present invention.

The inductance element 67 functions to prevent the signal amplified by the E-type MESFET 45 from leaking to the side of the drain voltage source via the E-type MESFET 46. In the dc formation, the source of the E-type MESFET 46 is shortcircuited and connected to the drain of the E-type MESFET 45.

The second embodiment of the present invention has the same effects as those of the first embodiment thereof, and has an additional advantage in that the signal amplified by the E-type MESFET 45 can be prevented from leaking to the drain voltage source via the E-type MESFET 46 and can be efficiently transferred to the next-stage circuit.

It is possible to omit the resistor 50 provided between the gate bias control voltage input terminal 49 and the gate of the E-type MESFET 46.

Figure 8:
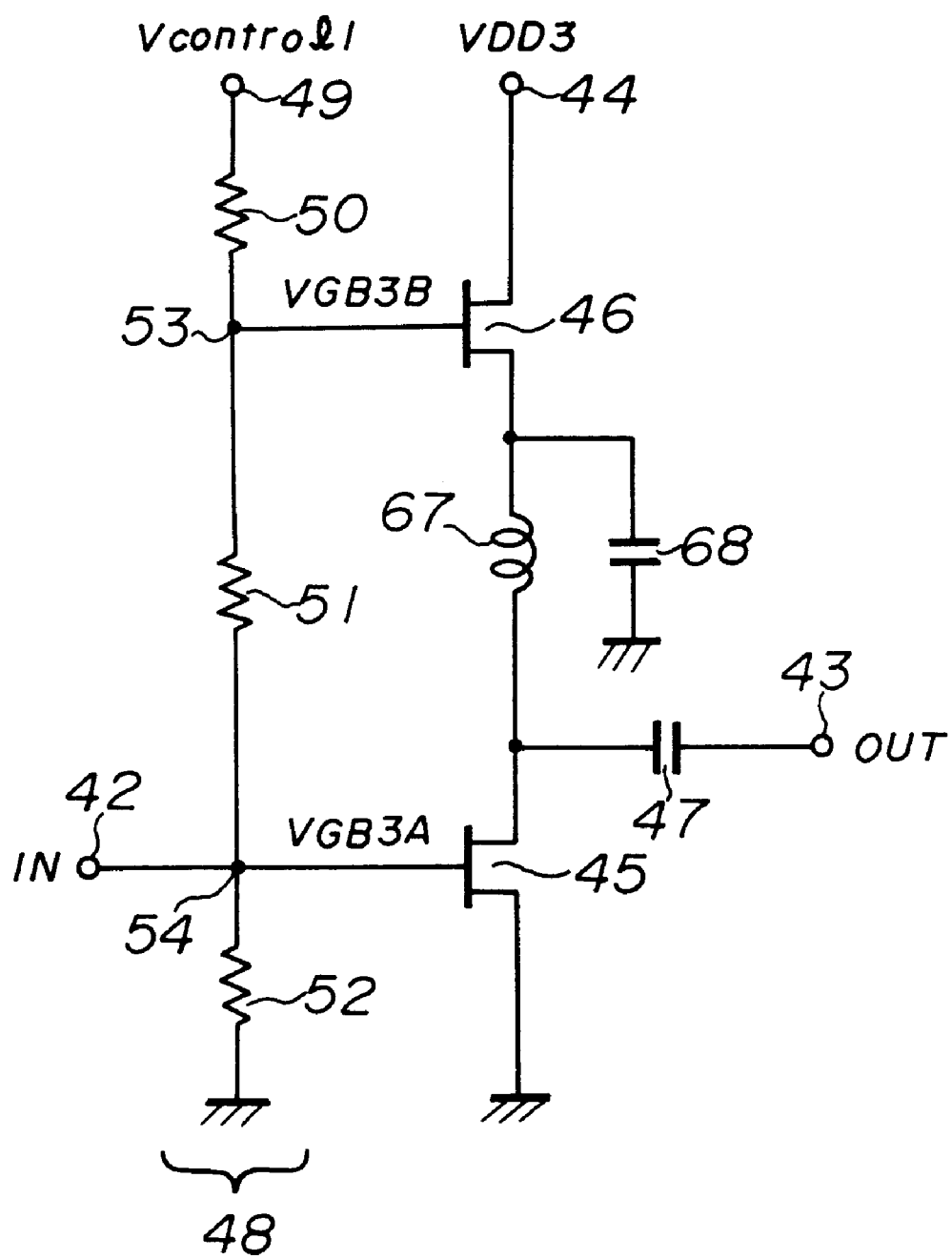
FIG. 8 is a circuit diagram of an amplifier circuit according to a third embodiment of the present invention.

A description will now be given, with reference to FIG. 8, of an amplifier circuit according to a third embodiment of the present invention. In FIG. 8, parts that are the same as those shown in the previously described figures are given the same reference numbers. According to the third embodiment of the present invention, the source of the E-type MESFET 46 is grounded via a capacitance element 68. The other circuit portions of the third embodiment of the present invention are the same as those of the circuit shown in FIG. 7.

The capacitance element 68 causes signals having frequencies lower than the signal to be amplified by the E-type MESFET 45 and noise applied from the drain voltage source via the drain voltage input terminal 44 to flow to the ground.

The third embodiment of the present invention thus configured has the advantages as those of the second embodiment thereof and an additional advantage in that signals having frequencies lower than the signal to be amplified by the E-type MESFET 45 and noise applied from the drain voltage source via the drain voltage input terminal 44 can be prevented from being transferred to the next-stage circuit.

It is possible to omit the resistor 50 provided between the gate bias control voltage input terminal 49 and the gate of the E-type MESFET 46.

Figure 9:
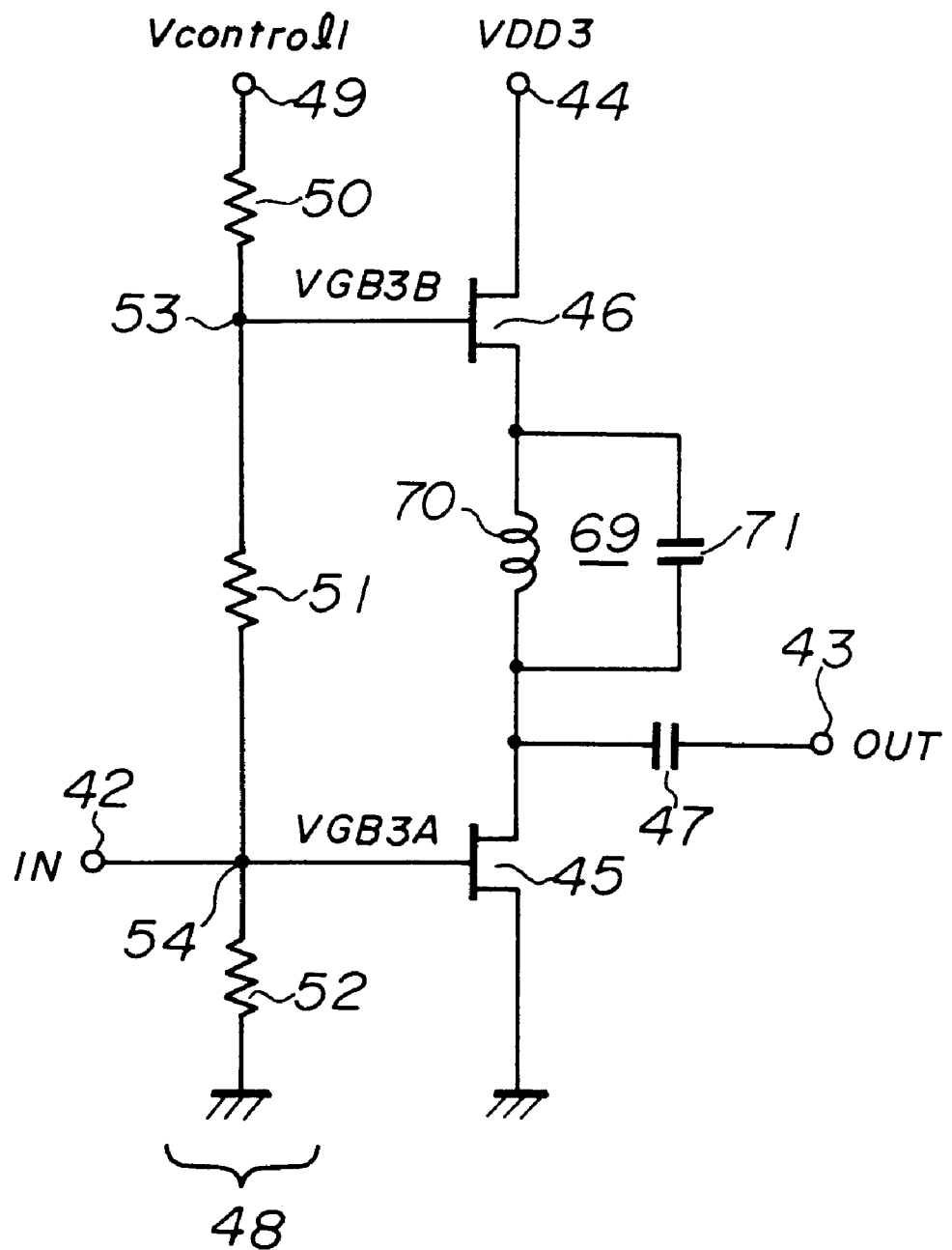
FIG. 9 is a circuit diagram of an amplifier circuit according to a fourth embodiment of the present invention.

A description will now be given, with reference to FIG. 9, of an amplifier circuit according to a fourth embodiment of the present invention. In FIG. 9, parts that are the same as those shown in the previously described figures are given the same reference numbers. According to the fourth embodiment of the present invention, the source of the E-type MESFET 46 is coupled to the drain of the E-type MESFET 45 via a parallel resonation circuit 69. The other circuit portions of the circuit shown in FIG. 9 are the same as those of the circuit according to the first embodiment of the present invention.

The parallel resonation circuit 69 is made up of an inductance element 70 and a capacitance element 71, and resonates at a frequency of the signal to be amplified by the E-type MESFET 45.

The fourth embodiment of the present invention has the same advantages as those of the first embodiment thereof and another advantage in that signals having frequencies other than the frequency of the signal to be amplified by the E-type MESFET 45 can be prevented from being transferred to the next-stage circuit, so that the selectivity can be improved.

It is possible to omit the resistor 50 provided between the gate bias control voltage input terminal 49 and the gate of the E-type MESFET 46.

Figure 10:
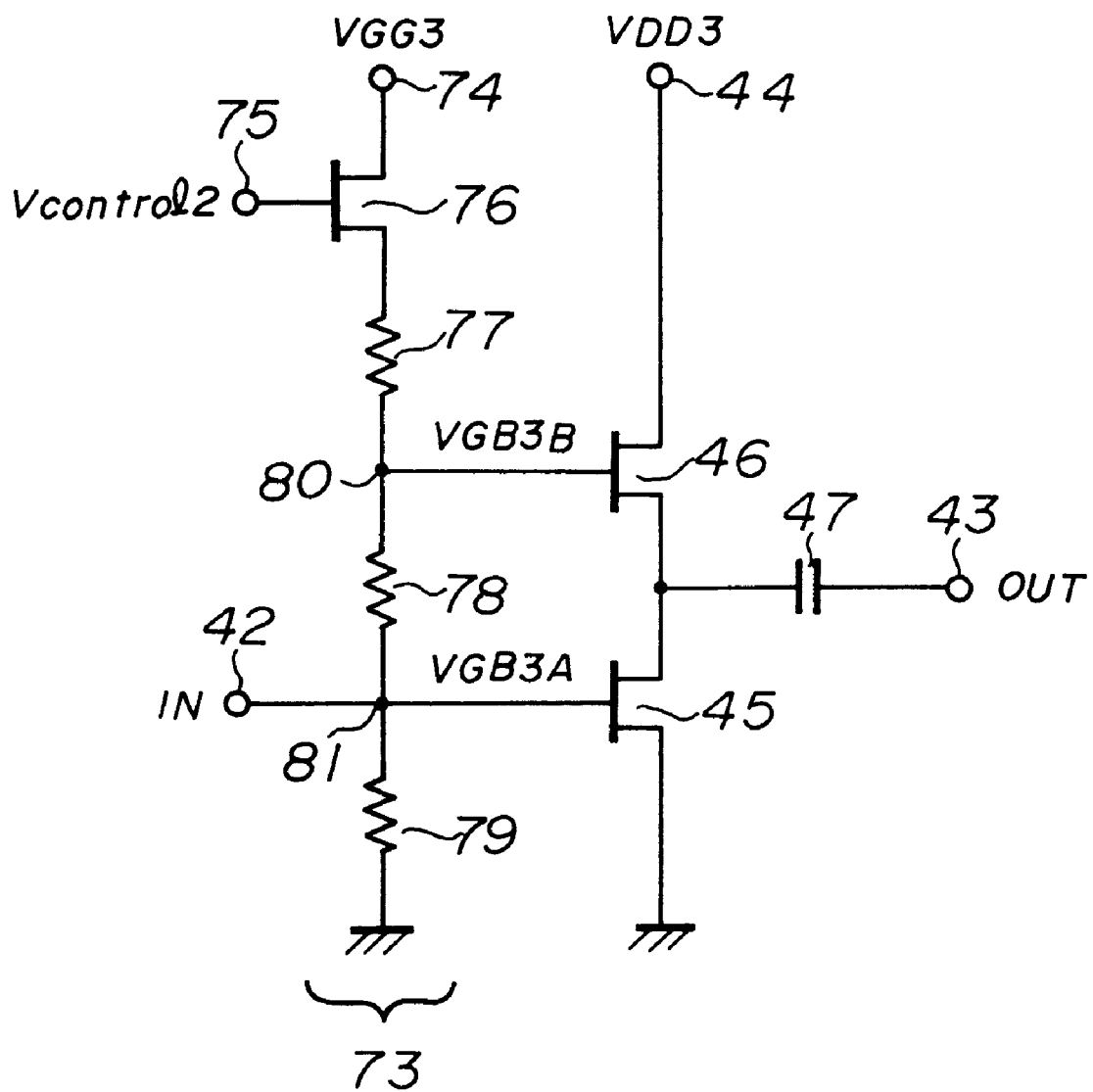
FIG. 10 is a circuit diagram of an amplifier circuit according to a fifth embodiment of the present invention.

A description will now be given, with reference to FIG. 10, of an amplifier circuit according to a fifth embodiment of the resent invention. In FIG. 10, parts that are the same as those shown in the previously described figures are given the same reference numbers. The fifth embodiment of the present invention includes a gate bias circuit 73 having a configuration different from that of the gate bias circuit 48 of the first embodiment of the present invention. The other circuit portions of the fifth embodiment of the present invention are the same as those of the first embodiment thereof.

The gate bias circuit 73 includes a gate bias source voltage input terminal 74, a gate bias control voltage input terminal 75, an E-type MESFET 76, and resistors 77, 78 and 79. A positive gate bias source voltage VGG3 from a gate bias source is applied to the gate bias source voltage input terminal 74. A positive gate bias control voltage $V_{control2}$ which controls the gate bias voltages VGB3A and VGB3B is applied to the gate bias control voltage input terminal 75. The control voltage $V_{control2}$ is a variable voltage for controlling the gate bias voltages VGB3A and VGB3B. The E-type MESFET 76 controls the gate bias voltages VGB3A and VGB3B.

The fifth embodiment of the present invention is on the assumption that the gate bias control voltage source which outputs the gate bias control voltage $V_{control2}$ is not capable of generating 0 V and the lower limit of the voltage $V_{control2}$ is equal to, for example, 0.2 V.

The E-type MESFET 76 has a drain connected to the gate bias source voltage input terminal 74, and a gate connected to the gate bias control voltage input terminal 75. The resistors 77, 78 and 79 are connected in series between the source of the E-type MESFET 76 and the ground. A connection node 80 between the resistors 77 and 78 is connected to the gate of the E-type MESFET 46, and a connection node 81 between the resistors 78 and 79 is connected to the gate of the E-type MESFET 45.

According to the fifth embodiment of the present invention thus configured, it is possible to control gain by varying the gate bias control voltage $V_{control2}$ in the active state. For example, as the value of the gate bias control voltage $V_{control2}$ is increased, the ON resistance of the E-type MESFET 76 is decreased, and the current flowing in the resistors 77–79 is increased. Further, the gate bias voltage VGB3B of the E-type MESFET 46 is increased, and the ON resistance of the E-type MESFET 46 is decreased. The drain voltage of the E-type MESFET 45 is increased and the gate bias voltage VGB3A is increased. As a result, the output level is increased.

As the value of the gate bias control voltage $V_{control2}$ is decreased, the ON resistance of the E-type MESFET 76 is increased, and the current flowing in the resistors 77–79 is decreased. Further, the gate bias voltage VGB3B of the E-type MESFET 46 is decreased, and the ON resistance of the E-type MESFET 46 is increased. The drain voltage of the E-type MESFET 45 is decreased, and the gate bias voltage VGB3A is decreased. Hence, the output level is decreased.

With the above in mind, the fifth embodiment of the present invention determines the value of the gate bias source voltage VGG3, the characteristics of the E-type MESFETs 46 and 47 and the resistance values of the resistors 77, 78 and 79 so that in response to a variation of the gate bias control voltage $V_{control2}$, the drain voltage of the E-type MESFET 45 is changed between 4 V and 0 V, and the gate bias voltage VGB3A is changed between 0.4 V and 0 V.

When the amplifier circuit shown in FIG. 10 is made inactive, the gate bias control voltage $V_{control2}$ is decreased to the lower limit, and the drain voltage of the E-type MESFET 45 and the gate bias voltage VGB3A are fixed to 0 V. Hence, even if the input signal IN is applied to the E-type MESFET 45, the drain current cannot flow in the E-type MESFET 45.

As described above, according to the fifth embodiment of the present invention, only positive voltages such as the drain voltage VDD3, the gate bias source voltage VGG3 and the gate bias control voltage $V_{control2}$, and any negative voltages are not needed, because only the E-type MESFETs are used. Hence, it is necessary to provide only a positive power source, while a negative power source is not needed.

Further, it is possible to greatly attenuate the input signal IN by changing the drain voltage of the E-type MESFET 45 and the gate bias voltage VGB3A by changing the gate bias control voltage $V_{control2}$ in the active state. In the inactive state, it is possible to prevent the drain current from flowing in the E-type MESFET 45 by decreasing the gate bias control voltage $V_{control2}$ to the lower limit and the fixing the drain voltage of the E-type MESFET 45 and the gate bias voltage VGB3A to 0 V. Hence, it is not necessary to provide a switch element (switch module) directed to shutting the drain current between the drain voltage source and the drain voltage input terminal 44. As a result, power consumption can be reduced nevertheless and a switch element is not required.

It is possible to omit the resistor 77 provided between the source of the E-type MESFET 76 and the gate thereof.

It is also possible to employ an inductance element provided between the source of the E-type MESFET 46 and the drain of the E-type MESFET 45. In this case, it is possible to prevent the signal amplified by the E-type MESFET 45 from leaking to the drain voltage source via the E-type MESFET 46 and to efficiently transfer the signal amplified by the E-type MESFET 45 to the next-stage circuit.

It is also possible to employ, in addition to the above inductance element, a capacitance element connected between the source of the E-type MESFET 46 and the ground. In this case, it is possible to obtain, in addition to the advantage resulting from the inductance element, an advantage in that signals having frequencies lower than the frequency of the signal to be amplified by the E-type MESFET 45 and noise from the drain voltage source can be prevented from being transferred to the next-stage circuit.

It is also possible to employ a parallel resonance circuit provided between the source of the E-type MESFET 46 and the drain of the E-type MESFET 45. The parallel resonance circuit resonates at the frequency of the signal to be amplified by the E-type MESFET 45, and prevents signals other than the desired signal from being transferred to the next-stage circuit. Hence, the selectivity can be improved.

Figure 11:
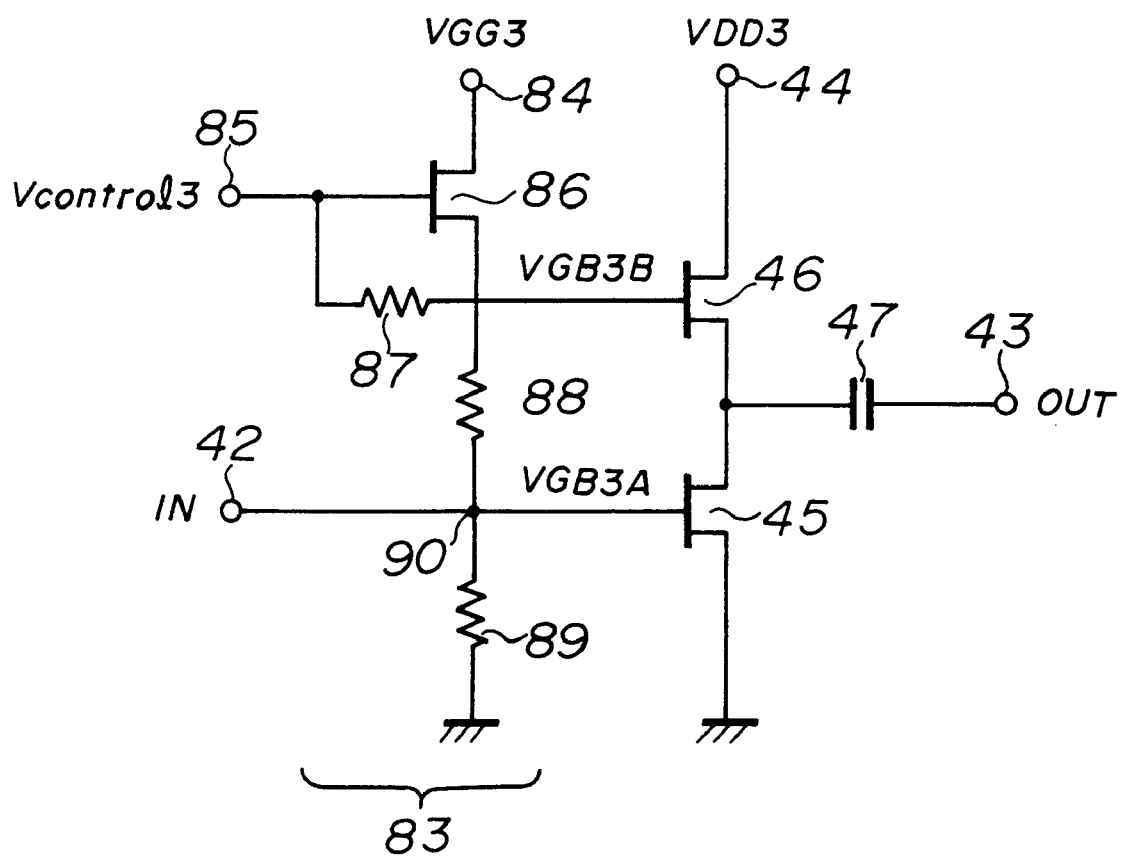
FIG. 11 is a circuit diagram of an amplifier circuit according to a sixth embodiment of the present invention.

A description will now be given, with reference to FIG. 11, of an amplifier circuit according to a sixth embodiment of the present invention. In FIG. 11, parts that are the same as those used in the first embodiment of the present invention are given the same reference numbers. The sixth embodiment of the present invention employs a gate bias circuit 83 having a configuration different from that of the gate bias circuit 48 used in the first embodiment of the present invention. The other parts of the sixth embodiment of the present invention are the same as those of the first embodiment thereof.

The gate bias circuit 83 includes a gate bias source voltage input terminal 84, a gate bias control voltage input terminal 85, an E-type MESFET 86, and resistors 87, 88 and 89. The positive gate bias source voltage VGG3 from the gate bias source is applied to the gate bias source voltage input terminal 84. A positive gate bias control voltage $V_{control3}$ which controls the gate bias voltages VGB3A and VGB3B is applied to the gate bias control voltage input terminal 85. The control voltage $V_{control3}$ is a variable voltage for controlling the gate bias voltages VGB3A and VGB3B. The E-type MESFET 86 controls the gate bias voltages VGB3A and VGB3B.

The sixth embodiment of the present invention is on the assumption that the gate bias control voltage source which outputs the gate bias control voltage $V_{control3}$ is not capable of generating 0 V and the lower limit of the voltage $V_{control3}$ is equal to, for example, 0.2 V.

The drain of the E-type MESFET 86 is connected to the gate bias source voltage input terminal 84, and the gate thereof is connected to the gate bias control voltage input terminal 85, which is connected to the gate of the E-type MESFET 46 via the resistor 87. The resistors 88 and 89 are connected in series between the source of the E-type MESFET 86 and the ground. A connection node 90 between the resistors 88 and 89 is connected to the gate of the E-type MESFET 45.

According to the sixth embodiment of the present invention, it is possible to control the gain by varying the gate bias control voltage $V_{control3}$ in the active state. For example, as the value of the gate bias control voltage $V_{control3}$ is increased, the gate bias VGB3B of the E-type MESFET 46 is increased, and the ON resistance of the E-type MESFET 46 is decreased. Further, the drain voltage of the E-type MESFET 45 is increased and the ON resistance of the E-type MESFET 86 is decreased. The current flowing in the resistors 88 and 89 is increased, and the gate bias voltage VGB3A is increased. Hence, the output level is increased.

As the gate bias control voltage $V_{control3}$ is decreased, the gate bias voltage VGB3B of the E-type MESFET 46 is decreased, and the ON resistance of the E-type MESFET 46 is increased. Further, the drain voltage of the E-type MESFET 45 is decreased, and the ON resistance of the E-type MESFET 86 is increased. Hence, the current flowing in the resistors 88 and 89 is reduced, and the gate bias voltage VGB3A is decreased. Hence, the output level is decreased.

With the above in mind, the sixth embodiment of the present invention determines the value of the gate bias source voltage VGG3, the characteristics of the E-type MESFETs 46 and 48 and the resistance values of the resistors 87, 88 and 89 so that in response to a variation of the gate bias control voltage $V_{control3}$, the drain voltage of the E-type MESFET 45 is changed between 4 V and 0 V, and the gate bias voltage VGB3A is changed between 0.4 V and 0 V.

When the amplifier circuit shown in FIG. 11 is made inactive, the gate bias control voltage $V_{control3}$ is decreased to the lower limit, and the drain voltage of the E-type MESFET 45 and the gate bias voltage VGB3A are fixed to 0 V. Hence, even if the input signal IN is applied to the E-type MESFET 45, the drain current cannot flow in the E-type MESFET 45.

As described above, according to the sixth embodiment of the present invention, only positive voltages such as the drain voltage VDD3, the gate bias source voltage VGG3 and the gate bias control voltage $V_{control3}$, and any negative voltages are not needed, because only the E-type MESFETs are used. Hence, it is necessary to provide only a positive power source, while a negative power source is not needed.

Further, it is possible to greatly attenuate the input signal IN by changing the drain voltage of the E-type MESFET 45 and the gate bias voltage VGB3A by changing the gate bias control voltage $V_{control3}$ in the active state. In the inactive state, it is possible to prevent the drain current from flowing in the E-type MESFET 45 by decreasing the gate bias control voltage $V_{control3}$ to the lower limit and the fixing the drain voltage of the E-type MESFET 45 and the gate bias voltage VGB3A to 0 V. Hence, it is not necessary to provide a switch element (switch module) directed to shutting the drain current between the drain voltage source and the drain voltage input terminal 44. As a result, power consumption can be reduced nevertheless and a switch element is not required.

It is possible to omit the resistor 87 provided between the gate bias control voltage input terminal 85 and the E-type MESFET 46.

It is also possible to employ an inductance element provided between the source of the E-type MESFET 46 and the drain of the E-type MESFET 45. In this case, it is possible to prevent the signal amplified by the E-type MESFET 45 from leaking to the drain voltage source via the E-type MESFET 46 and to efficiently transfer the signal amplified by the E-type MESFET 45 to the next-stage circuit.

It is also possible to employ, in addition to the above inductance element, a capacitance element connected between the source of the E-type MESFET 46 and the ground. In this case, it is possible to obtain, in addition to the advantage resulting from the inductance element, an advantage in that signals having frequencies lower than the frequency of the signal to be amplified by the E-type MESFET 45 and noise from the drain voltage source can be prevented from being transferred to the next-stage circuit.

It is also possible to employ a parallel resonance circuit provided between the source of the E-type MESFET 46 and the drain of the E-type MESFET 45. The parallel resonance circuit resonates at the frequency of the signal to be amplified by the E-type MESFET 45, and prevents signals other than the desired signal from being transferred to the next-stage circuit. Hence, the selectivity can be improved.

A description will now be given, with reference to FIG. 12, of an amplifier circuit according to a seventh embodiment of the present invention. The amplifier circuit shown in FIG. 12 includes a signal input terminal 92, a signal output terminal 93, a drain voltage input terminal 94, an E-type MESFET functioning as an amplifying element, and a capacitance element 96 for DC isolation. A positive drain voltage VDD5 is applied to the drain voltage input terminal 94.

The gate of the E-type MESFET 95 is connected to the signal input terminal 92, and the drain thereof is connected to the drain voltage input terminal 94 and to the signal output terminal 93 via the capacitance element 96.

Figure 12:
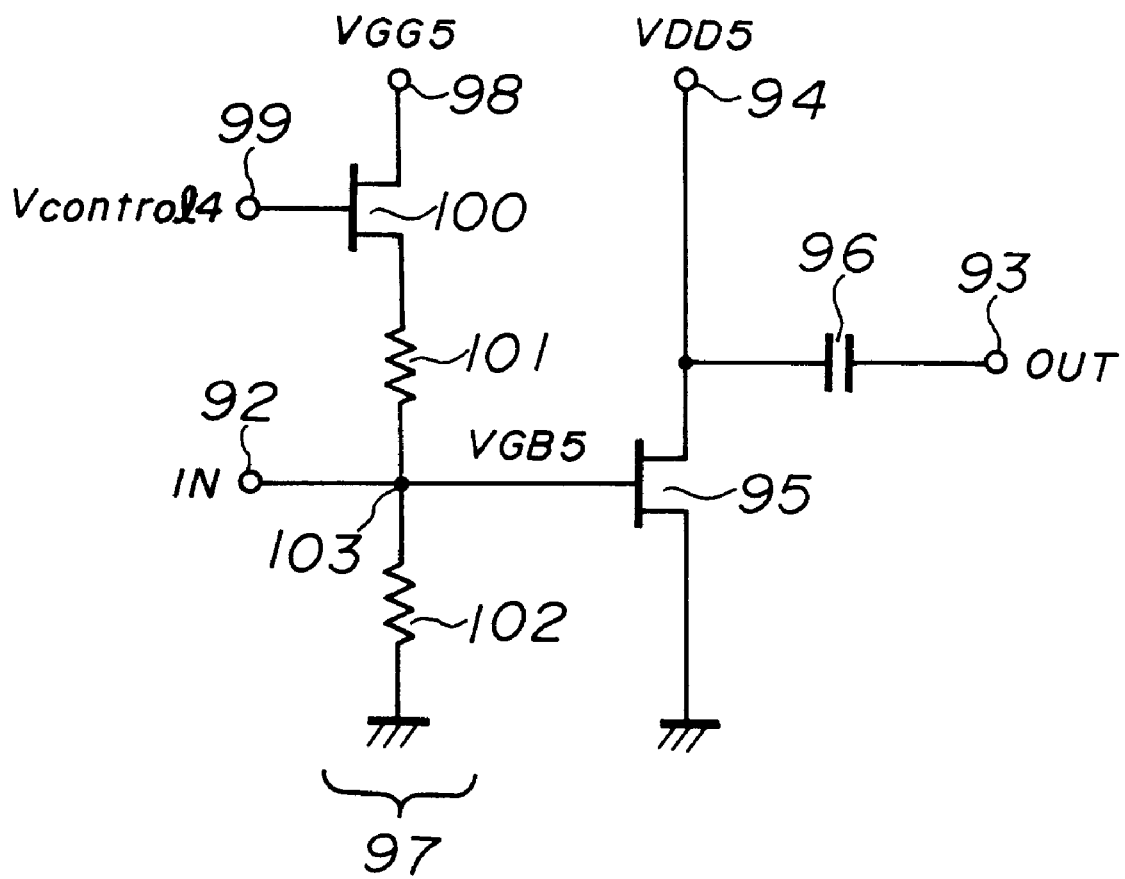
FIG. 12 is a circuit diagram of an amplifier circuit according to a seventh embodiment of the present invention.

The amplifier circuit shown in FIG. 12 includes a gate bias circuit 97, which supplies the gate of the E-type MESFET 95 with a positive gate bias voltage VGB5. The circuit 97 includes a gate bias source voltage input terminal 98 via which a positive gate bias source voltage VGG5 is supplied. The circuit 97 has a gate bias control voltage input terminal 99, an E-type MESFET 100, and resistors 101 and 102. A positive gate bias control voltage $V_{control4}$ having a variable voltage value is applied to the terminal 99 as a control signal for controlling the gate bias voltage VGB5. The E-type MESFET 100 controls the gate bias voltage VGB5.

The seventh embodiment of the present invention is on the assumption that the gate bias control voltage source which outputs the gate bias control voltage $V_{control4}$ is not capable of generating 0 V and the lower limit of the voltage $V_{control4}$ is equal to, for example, 0.2 V.

The drain of the E-type MESFET 100 is connected to the gate bias source voltage input terminal 98, and the gate thereof is connected to the bias control voltage input terminal 99. The resistors 101 and 102 are connected in series between the source of the E-type MESFET 100 and the ground. A connection node 103 between the resistors 101 and 102 is connected to the gate of the E-type MESFET 95.

According to the seventh embodiment of the present invention, it is possible to control the gain by varying the gate bias control voltage $V_{control4}$ in the active state. For example, as the value of the gate bias control voltage $V_{control4}$ is increased, the ON resistance of the E-type MESFET 100 is decreased, and the current flowing in the resistors 101 and 102 is increased. Further, the gate bias voltage VGB5 of the E-type MESFET 95 is increased, and the output level is increased.

As the value of the gate bias control voltage $V_{control4}$ is reduced, the ON resistance of the E-type MESFET 100 is increased, and the current flowing in the resistors 101 and 102 is decreased. The gate bias voltage VGB5 of the E-type MESFET 95 is decreased, and the output level is reduced.

With the above in mind, the seventh embodiment of the present invention determines the value of the gate bias source voltage VGG5, the characteristic of the E-type MESFET 100 and the resistance values of the resistors 101 and 102 so that the following conditions are satisfied. The gate bias control voltage $V_{control4}$ can be varied between 2.5 V and 0.2 V. When the gate bias control voltage $V_{control4}$ is equal to 2.5 V, the gate bias voltage VGB5 is equal to 0.5 V. When the gate bias control voltage $V_{control4}$ is equal to 0.2 V, the gate bias voltage VGB5 is close to 0 V.

When the amplifier circuit shown in FIG. 12 is made inactive, the gate bias control voltage $V_{control4}$ is set to 0.2 V. In this case, the gate bias voltage VGB5 can be set close to 0 V, and it is thus possible to set the drain current flowing in the E-type MESFET 95 equal to or lower than tens of microamperes.

In order to reduce the current flowing in the drain of the E-type MESFET 59 to a value as small as possible in the inactive state, it is necessary to supply the gate of the E-type MESFET 59 with a voltage much lower than the threshold voltage thereof, that is, a voltage as close to 0 V as possible. If the above cannot be performed, the drain current will be increased and the power consumption will also be increased.

Due to a limitation on the gate bias source which generates the gate bias source voltage VGG4, the gate bias source voltage VGG4 cannot be reduced until the gate bias voltage VGB4 is set equal to 0 V. In this case, it is impossible to reduce power consumption.

According to the seventh embodiment of the present invention, even if the gate bias control voltage $V_{control4}$ cannot be set to 0 V, the gate bias voltage VGB5 can be made close to 0 V by setting the gate bias control voltage $V_{control4}$ equal to 0.2 V. Hence, it is possible to set the drain current flowing in the E-type MESFET 95 equal to or lower than tens of microamperes and to thus reduce power consumption.

The inventors found that in the amplifier circuit shown in FIG. 5, a current IGG flowing in the gate of the E-type MESFET 59 in a saturated output operation is approximately twice or three times the current flowing when a D-type MESFET is used. For example, when the E-type MESFET 59 is a 3W-class transistor, the gate current IGG of 10–20 mA flows. Hence, there is a possibility that the gate bias VGB4 is decreased due to a voltage drop developing across the resistor 63 through which the gate current IGG4 flows. In this case, the circuit will shift to a state in which the output level is decreased.

If the resistors 63 and 64 have sufficiently small values, a decrease in the gate bias voltage VGB4 can be suppressed even if the gate current IGG4 is large. However, if the resistance values of the resistors 63 and 64 are too small, a sufficient current cannot be supplied to the resistors 63 and 64 due to the current supply ability of the gate bias source. Even if the current supply ability of the gate bias source can be increased, a large current flows in the resistors 63 and 64 with the gate bias voltage VGB4 applied. Hence, power consumption cannot be reduced.

According to the seventh embodiment, the gate bias control voltage $V_{control4}$ can be set equal to 0.2 V in the inactive state even if the resistance values of the resistors 101 and 102 are sufficiently reduced so that a large current is allowed to flow therein and a decrease in the gate bias voltage VGB5 caused by the current flowing to the gate of the E-type MESFET 95 is prevented. Hence, the current flowing in the resistors 101 and 102 can be reduced and power consumption can be reduced.

Now, a case will be considered where the amplifier circuit shown in FIG. 5 is used in the power amplifier of the transmit circuit of the portable telephone set, and an automatic power control voltage Vapc for controlling the transmit power is employed and applied to the gate bias source voltage input terminal 62 instead of the gate bias source voltage VGG4.

Normally, the automatic power control voltage Vapc can be varied within a range of approximately 0.2 V to 2.5 V, and the upper limit of an automatic power control current Iapc is approximately equal to 5 mA. It is assumed that when the automatic power control voltage Vapc is equal to 2.5 V, the voltage applied across the gate and source of the E-type MESFET 59 in operation is 0.5 V. In this case, it is required that the ratio of the resistance value of the resistor 63 to that of the resistor 64 is 4:1.

The minimum value of the sum of the resistance values of the resistors 63 and 64 is obtained by Vapc-max/Iapc-max, and is equal to 500 Ω. Hence, the above sum becomes greater than 500 Ω, and the resistance value of the resistor 63 is greater than 400 Ω.

With the above in mind, when the tolerable variation value of the voltage between the gate and source of the E-type MESFET 59 is set equal to, for example, 0.1 V, the current IGG4 flowing to the gate of the E-type MESFET 59 is determined as follows. The value obtained by (the resistance value of the resistor 63)×IGG4 is less than 0.1 V. Hence, IGG4 is less than (0.1 V/400 Ω), namely, 0.25 mA. In terms of the above, if the current IGG4 flowing in the gate and source of the E-type MESFET 59 is equal to or greater than 0.5 mA, the tolerable variation value of the voltage between the gate and source of the E-type MESFET 59 exceeds 0.1 V. In this case, the configuration according to the seventh embodiment of the present invention is required.

The seventh embodiment of the present invention employs only the E-type MESFETs, and thus the drain voltage VDD5, the gate bias source voltage VGG5 and the gate bias control voltage $V_{control4}$ are positive voltages, which can be produced by a positive power source. That is, no negative power source is needed.

In the active state, it is possible to control the gain by varying the gate bias control voltage $V_{control4}$ and thus changing the gate bias voltage VGB5 of the E-type MESFET 95.

In the inactive state, it is possible to prevent the drain current from flowing in the E-type MESFET 95 by decreasing the gate bias control voltage $V_{control4}$ to the lower limit and setting the gate bias voltage VGB5 of the E-type MESFET 95 close to 0 V. Hence, it is possible to reduce power consumption without any switch element (switch module) directed to shutting the drain current between the drain voltage source and the drain voltage input terminal 94.

It is possible to omit the resistor 101 between the source of the E-type MESFET 100 and the gate of the E-type MESFET 95.

A description will now be given of a multistage amplifier circuit according to an eight embodiment of the present invention.

Figure 13:
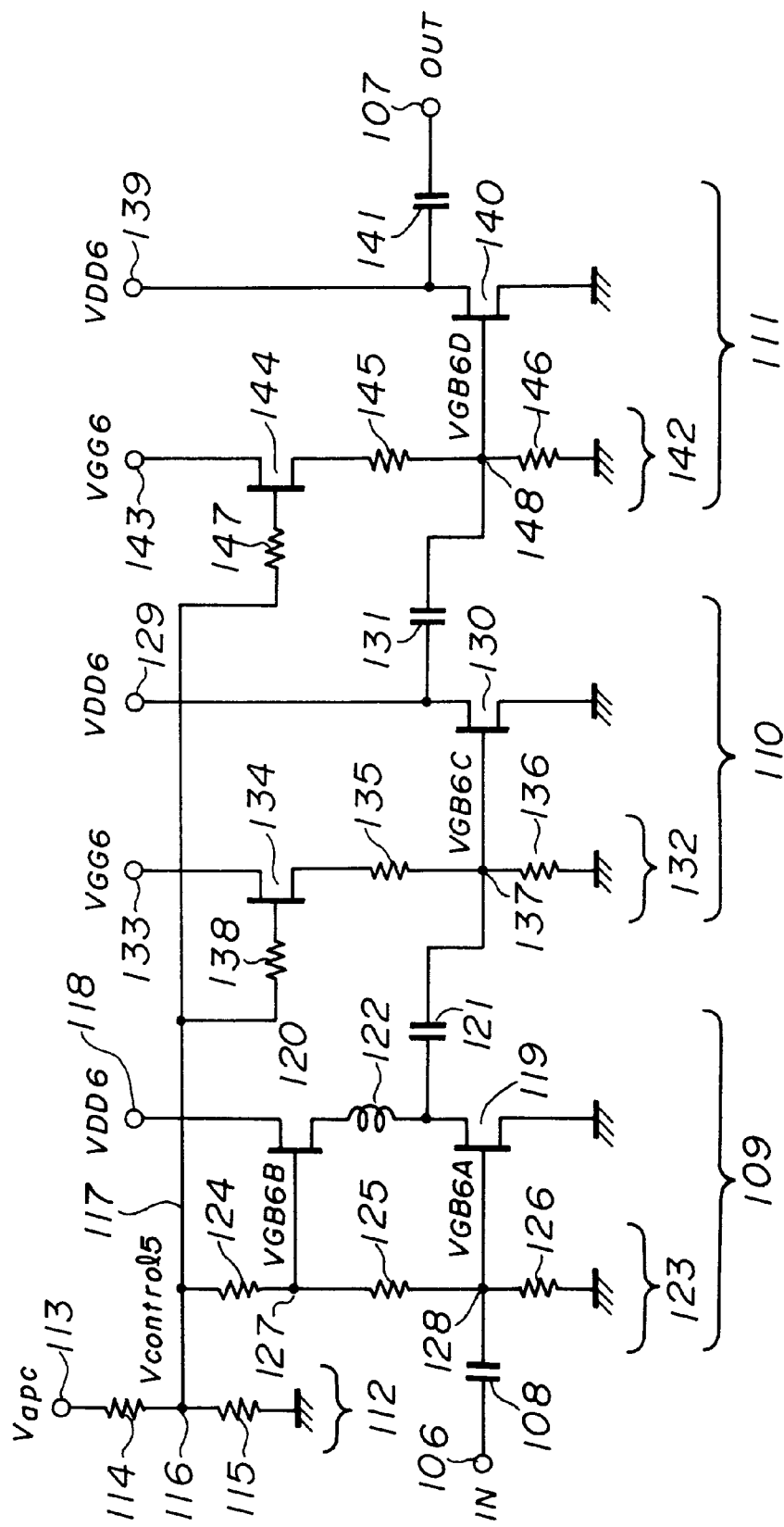
FIG. 13 is a circuit diagram of a multistage amplifier circuit according to an eighth embodiment of the present invention.

FIG. 13 is a circuit diagram of a multistage amplifier circuit according to the eight embodiment of the present invention, which is applied to the power amplifier of the transmit circuit part of the portable telephone set. The input signal (high frequency signal) IN is applied to a signal input terminal 106. An output signal (high frequency signal) OUT is output via a signal output terminal OUT. A capacitance element 108 prevents a DC component from DC isolation. There are provided three amplifier circuits 109, 110 and 111. A gate bias control voltage generating circuit 112 generates a gate bias control voltage $V_{control5}$ to be supplied to the amplifier circuits 109, 110 and 111.

The circuit 112 is configured as follows. The automatic power control voltage Vapc is applied to an automatic power control voltage input terminal 113. The voltage Vapc serves as a control signal which automatically controls the output level of the output signal OUT supplied from a control circuit part (not shown) of the portable telephone set. The circuit 112 includes two resistors 114 and 115 dividing the automatic power control voltage Vapc. The gate bias control voltage $V_{control5}$ is obtained at a connection node 116 between the resistors 114 and 115. A gate bias control voltage line 117 is connected to the connection node 116.

The amplifier circuit 109 is configured as follows. A positive drain voltage VDD6 is applied to a drain voltage input terminal 118. An E-type MESFET 119 functions as an amplifying element. An E-type MESFET 120 controls the drain voltage of the E-type MESFET 119. A capacitance element 121 is used for DC isolation. An inductance element 122 is provided between the source of the E-type MESFET 120 and the drain of the E-type MESFET 119.

The gate of the E-type MESFET 119 is connected to the signal input terminal 106 via the capacitance element 108, and the drain thereof is connected to the source of the E-type MESFET 120 via the inductance element 122 and to one end of the capacitance element 121. The source of the E-type MESFET 119 is grounded. The drain of the E-type MESFET 120 is connected to the drain voltage input terminal 118.

The amplifier circuit 109 includes a gate bias circuit 123, which supplies positive gate bias voltages VGB6A and VGB6B to the gates of the E-type MESFETs 119 and 120. The circuit 123 includes resistors 124, 125 and 126, which divide the gate bias control voltage $V_{control5}$. The resistors 124, 125 and 126 are connected in series between the gate bias control voltage line 117 and the ground. A connection node 127 between the resistors 124 and 125 is connected to the gate of the E-type MESFET 120. A connection node 128 between the resistors 125 and 126 is connected to the gate of the E-type MESFET 119.

The amplifier circuit 110 is configured as follows. The positive drain voltage VDD6 is applied to a drain voltage input terminal 129. An E-type MESFET 130 functions as an amplifying element. A capacitance element 131 is used for DC isolation. The gate of the E-type MESFET 130 is connected to the other end of the capacitance element 121, and the drain thereof is connected to the drain voltage input terminal 129 and one end of the capacitance element 131.

The amplifier circuit 110 includes a gate bias circuit 132, which supplies a positive gate bias voltage VGB6C to the gate of the E-type MESFET 130. The circuit 132 has a gate bias source voltage input terminal to which the positive gate bias source voltage VGG6 is applied. The circuit 132 includes an E-type MESFET 134, which controls the gate bias voltage VGB6C, and resistors 135 and 136. The drain of the E-type MESFET 134 is connected to the gate bias source voltage input terminal 133, and the gate thereof is connected to the gate bias voltage line 117 via a resistor 138. The resistor 138 attenuates the signal output to the gate of the E-type MESFET 134 in order to prevent occurrence of oscillation. If the signal amplified by the E-type MESFET 119 is fed back to the amplifier circuit 109 via the capacitance element 121, the resistor 135 and the source and gate of the E-type MESFET 134, the circuit may oscillate.

The resistors 135 and 136 are connected in series between the source of the E-type MESFET 134 and the ground. A connection node 137 between the resistors 135 and 136 is connected to the gate of the E-type MESFET 130.

The amplifier circuit 111 has a drain voltage input terminal 139 to which the positive drain voltage VDD6 is applied, an E-type MESFET 140 functioning as an amplifying element, and a capacitance element 141 for DC isolation. The gate of the E-type MESFET 140 is connected to the other end of the capacitance element 131, and the drain thereof is connected to the drain voltage input terminal 139 and to the signal output terminal 107 via the capacitance element 141. The source of the E-type MESFET 140 is grounded.

The amplifier circuit 111 includes a gate bias circuit 142, which supplies a positive gate bias voltage VGB6D to the gate of the E-type MESFET 140. The circuit 142 includes a gate bias source voltage input terminal 143, to which the positive gate bias source voltage VGG6 is applied. The circuit 142 includes an E-type MESFET 144 for controlling the gate bias voltage VGB6B, and resistors 145 and 146. The drain of the E-type MESFET 144 is connected to the gate bias source voltage input terminal 143, and the gate thereof is connected to the gate bias voltage line 117 via a resistor 147. The resistor 147 attenuates the signal output to the gate of the E-type MESFET 134 in order to prevent occurrence of oscillation. If the signal amplified by the E-type MESFET 130 is fed back to the amplifier circuits 109 and 110 via the capacitance element 131, the resistor 145 and the source and gate of the E-type MESFET 144 may oscillate.

The resistors 145 and 146 are connected in series between the source of the E-type MESFET 144 and the ground. A connection node 148 between the resistors 145 and 146 is connected to the gate of the E-type MESFET 140.

It will be noted that the first amplifier circuit 109 has the same configuration as that of the second embodiment of the present invention, and the amplifier circuits 110 and 111 of the second and third stages have the same configuration as that of the seventh embodiment of the present invention.

According to the multistage amplifier circuit of the eighth embodiment of the present invention thus configured, it is possible to provide, as the automatic power control voltage Vapc, the voltage necessary to obtain the transmit output determined by the positional relationship (distance) between the portable telephone set and a ground station.

Figure 14:
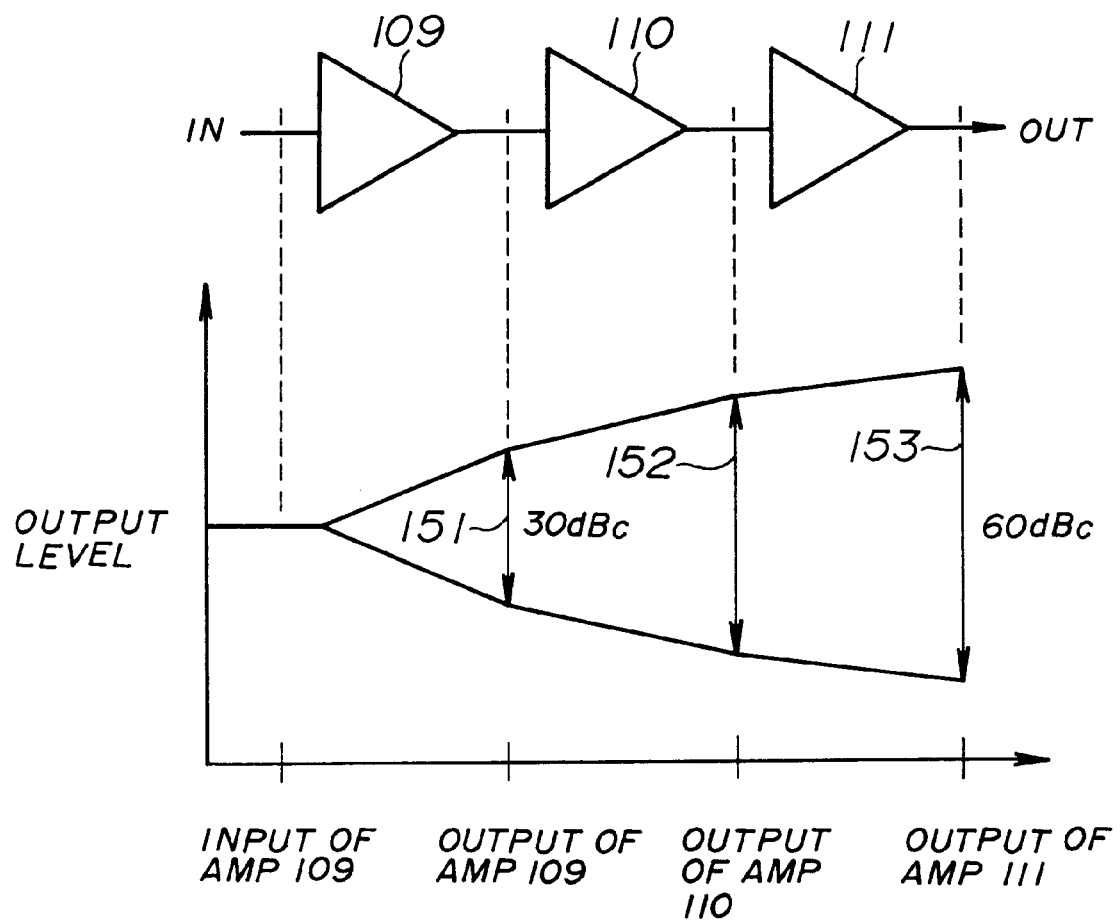
FIG. 14 is a diagram explaining variation ranges of the output levels of amplifiers 109, 110 and 111 shown in FIG. 13.

FIG. 14 is a diagram explaining ranges of variations in the output levels of the amplifier circuits 109, 110 and 111. The horizontal axis of FIG. 14 denotes the positions of the output terminals of the amplifier circuits 109, 110 and 111, and the vertical axis denotes the output level. In FIG. 14, an arrow 151 indicates a variation range of the output level of the amplifier circuit 109. An arrow 152 indicates a variation range of the output level of the amplifier circuit 110. An arrow 153 indicates a variation range of the output level of the amplifier 111, that is, the output signal OUT.

As is known, if the portable telephone set is close to the ground station, a signal received in the ground station will be distorted unless the transmit power is reduced according to the distance between the portable telephone set and the ground station. Hence, an instruction to reduce the transmit power is sent to the portable telephone set from the ground station. In response to this instruction, the automatic power control voltage Vapc is varied. It is required to have a variable range of the transmit output equal to 60 dBc.

In a case where the amplifier circuits 110 and 111 of the second and third stages are configured as shown in FIG. 13, it is necessary to set the variable range of the output level of the first-stage amplifier circuit 109 to be as large as 30 dBc in order to obtain a variable range of the output signal OUT of 60 dBc. The amplifier circuit 109 of the first stage has the same configuration as that of the second embodiment of the present invention. Thus, it is possible to vary the output level over 30 dBc and greatly attenuate the input signal IN.

Figure 15:
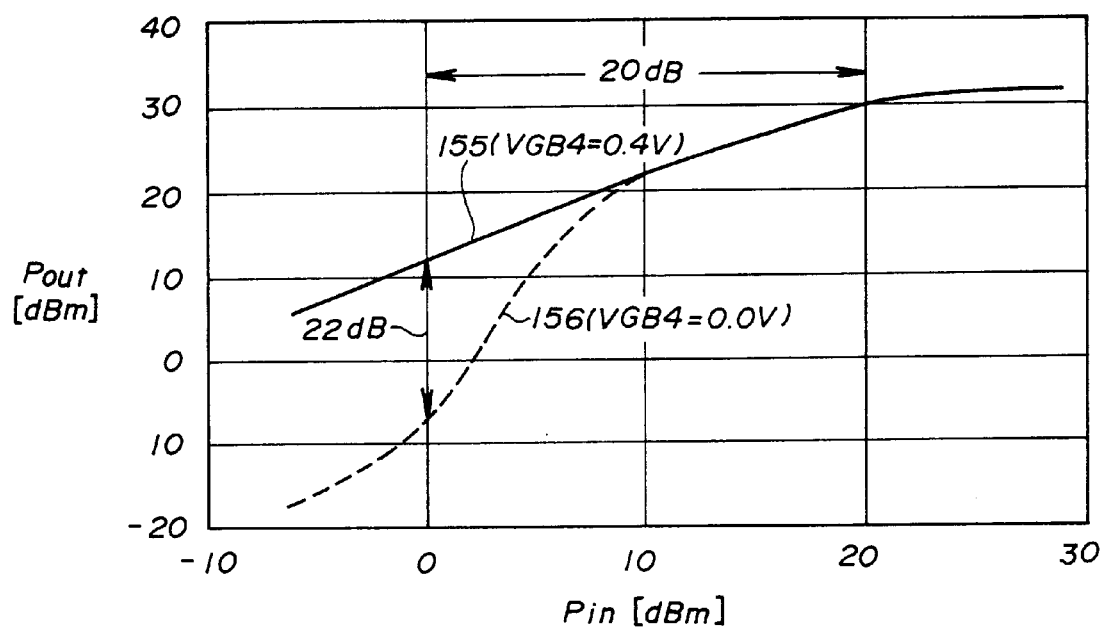
FIG. 15 is a graph of an input/output characteristic of the amplifier circuit shown in FIG. 5.

It may be possible to use the first-stage amplifier circuit 109 having the structure shown in FIG. 5. The input/output characteristic of the amplifier circuit shown in FIG. 5 is as shown in FIG. 15. In FIG. 15, a solid line 155 indicates a case where the gate bias voltage VGB4 of the E-type MESFET 59 is 0.4 V, and a broken line 156 indicates a case where the gate bias voltage VGB4 of the E-type MESFET 59 is 0.0 V. It can be seen from the graph of FIG. 15 that it is possible to obtain only the range of a variation in the output level Pout equal to 20 dBc by controlling the gate bias voltage VGB4 even if the input level Pin is decreased by 20 dB from the saturation level. Hence, it is impossible to greatly attenuate the input signal IN.

If the input level Pin can be varied, the variable range of the output level Pout can be set greater than 20 dBc. In practice, it is usually required that the power amplifier of the portable telephone set employs the fixed input level Pin in order to make the structure as simple as possible and reduce the production cost. In this regard, the amplifier circuit shown in FIG. 5 is not suitable for the amplifier circuit 109 of the first stage.

In the multistage amplifier circuit shown in FIG. 13, the automatic power control voltage Vapc equal to 0.2 V is supplied when the portable telephone set is receiving a signal or waiting for receipt of a signal. Hence, the gate bias voltage VGB6B of the E-type MESFET 120 in the amplifier circuit 109 is decreased, and the drain voltage of the E-type MESFET 119 can be set equal to 0 V. Further, the gate bias voltage VGB6A of the E-type MESFET 119 can be decreased close to 0 V. Hence, the drain current does not flow in the E-type MESFET 119.

The gate voltage of the E-type MESFET 134 in the amplifier circuit 110 is decreased, so that the gate bias voltage VGB6C of the E-type MESFET 130 can be set close to 0 V. As a result, it is possible to reduce the drain current flowing in the E-type MESFET 130 to a very small value.

The gate voltage of the E-type MESFET 144 in the amplifier circuit 111 is decreased, so that the gate bias voltage VGB6D of the E-type MESFET 140 can be set close to 0 V. As a result, it is possible to reduce the drain current flowing in the E-type MESFET 140 to a very small value.

As described above, the eighth embodiment of the present invention employs only the E-type MESFETs which operate with the positive voltages, and thus use only the positive drain voltage VDD6, the positive gate bias source voltage VGG6 and the positive automatic power control voltage Vapc. In other words, the eighth embodiment of the present invention does not require any negative voltages. Hence, it is possible to realize cost reduction and down sizing for the portable telephone sets.

The first-stage amplifier circuit 109 has the same structure as that of the second embodiment of the present invention. Hence, it is possible to obtain the variable range of the output level of the first-stage amplifier circuit 109 over 30 dBc and thus obtain the variable range of the output level of the final-stage amplifier circuit 111 over 60 dBc. As a result, it is possible to satisfy the transmit output variable range required for the portable telephone sets.

The second-stage amplifier circuit 110 has the same structure as that of the seventh embodiment of the present invention shown in FIG. 10. Hence, it is possible to reduce the current flowing in the resistors 135 and 136 in the E-type MESFET 134 at the time of receiving and waiting for a signal even if the resistors 135 and 136 are small so as to make a large current flow in these resistors and prevent the gate bias voltage VGB6C from being reduced by the current flowing to the gate of the E-type MESFET 130. Hence, it is possible to reduce power consumption.

The third-stage amplifier circuit 111 has the same structure as that of the seventh embodiment of the present invention. Hence, it is possible to reduce the current flowing in the resistors 145 and 146 in the E-type MESFET 144 at the time of receiving and waiting for a signal even if the resistors 145 and 146 are small so as to make a large current flow in these resistors and prevent the gate bias voltage VGB6D from being reduced by the current flowing to the gate of the E-type MESFET 140. Hence, it is possible to reduce power consumption.

At the time of receiving or waiting for a signal, the drain current does not flow in the E-type MESFET 119 and very small drain currents flow in the E-type MESFETs 130 and 140. From this point of view, power consumption can be reduced. Additionally, it is not necessary to use a switch module to shut the drain currents of the E-type MESFETs 119, 130 and 140 at the time of receiving or waiting for a signal. From this point of view, power consumption can be reduced and down sizing can be realized.

The amplifier circuit 109 of the first stage can be configured so as to have the same configuration as the first, third, fourth, fifth or sixth embodiment of the present invention.

It is possible to omit the resistors 114 and 115 connected in series between the automatic power control voltage input terminal 113 and the ground. In this case, the terminal 113 is directly connected to the gate bias control voltage line 117. It is also possible to omit the resistor 124 between the gate bias control voltage line 117 and the gate of the E-type MESFET 120. It is also possible to omit the resistor 135 provided between the source of the E-type MESFET 134 and the gate of the E-type MESFET 130 as well as the resistor 145 provided between the source of the E-type MESFET 144 and the gate of the E-type MESFET 140.

It is also possible to omit the resistor 138 provided between the gate of the E-type MESFET 134 and the gate bias control voltage line 117 and the resistor 144 provided between the gate of the E-type MESFET 144 and the line 117.

The MESFETs used in the present invention are, for example, MESFETs using compound semiconductor elements.

The present invention is not limited to the specifically disclosed embodiments, and variations and modifications may be made without departing from the scope of the present invention.

What is claimed is:

1. An amplifier circuit comprising:
   a first FET of an enhancement type having a gate supplied with an input signal and a gate bias voltage and a drain via which an amplified output signal is output; and
   a second FET of the enhancement type having a drain connected to a drain voltage source, a source connected to the drain of the first FET, and a gate supplied with a control signal independent from said drain voltage source for controlling the drain voltage supplied to the first FET, wherein an increase and decrease in the gate bias voltage of the first FET is controlled by said control signal,
   wherein all of the power supplied to said first and second FETs is from a positive power supply.

2. The amplifier circuit as claimed in claim 1, wherein the control signal supplied to the gate of the second FET is supplied to the gate of the first FET as the gate bias voltage of the first FET.

3. The amplifier circuit as claimed in claim 2, wherein the gate bias voltage of the first FET is a voltage obtained by dividing the control signal by resistors.

4. The amplifier circuit as claimed in claim 2, wherein the gate of the second FET is supplied with the control signal via a resistor.

5. The amplifier circuit as claimed in claim 3, wherein the source of the second FET is connected to the drain of the first FET via an inductance element.

6. The amplifier circuit as claimed in claim 5, wherein the source of the second FET is grounded via a capacitance element.

7. The amplifier circuit as claimed in claim 1, further comprising a third FET of the enhancement type having a drain connected to the gate bias source for the first FET, a gate supplied with the control signal, and a source,
   wherein a source voltage obtained at the source of the third FET is supplied to the gate of the first FET as the gate bias voltage of the first FET.

8. The amplifier circuit as claimed in claim 7, wherein the gate bias voltage of the first FET is a voltage obtained by dividing the source voltage of the third FET by resistors.

9. The amplifier circuit as claimed in claim 8, wherein the gate of the second FET is supplied with the control signal via a resistor.

10. The amplifier circuit as claimed in claim 1, further comprising a third FET of the enhancement type having a drain connected to the gate bias source for the first FET, a gate supplied with the control signal, and a source,
    wherein a source voltage obtained at the source of the third FET is supplied to the gate of the first FET and the gate of the second FET.

11. The amplifier circuit as claimed in claim 10, wherein the gate bias voltage of the first FET is a voltage obtained by dividing the source voltage of the third FET by resistors.

12. The amplifier circuit as claimed in claim 11, wherein the source voltage of the third FET is supplied to the gate of the second FET via a resistor.

13. An amplifier circuit comprising:

a first FET of an enhancement type having a source, a gate supplied with an input signal and a gate bias voltage, and a drain via which an amplified output signal is output, thereby forming a current path directed to the source from the gate;

a second FET of the enhancement type having a drain connected to a gate bias supply source for the first FET, a gate supplied with a control signal independent from said gate bias supply source, and a source via which a source voltage controlled by the control signal is output, the source voltage being supplied to the gate of the first FET as gate bias voltage; and a resistance element having a first end connected to the source of the second FET and the gate of the first FET, and a second end grounded.

14. The amplifier circuit as claimed in claim 13, wherein the gate of the first FET is supplied, as the gate bias voltage, with a voltage obtained by dividing the source voltage of the second FET by resistors.

15. A multistage amplifier circuit comprising:

a first-stage amplifier circuit including a first FET of an enhancement type having a gate supplied with an input signal and a gate bias voltage, and a drain via which an amplified output signal is output, and a second FET of the enhancement type having a drain connected to a drain voltage source, a source connected to the drain of the first FET and a gate supplied with a variable control signal for controlling a drain voltage supplied to the first FET; and a second-stage amplifier circuit amplifying an output signal of the first-stage amplifier circuit, wherein another variable control signal for controlling a gain of the second-stage amplifier circuit is applied to the second-stage amplifier circuit.

16. The multistage amplifier circuit as claimed in claim 15, wherein the variable control signal supplied to the gate of the second FET and said another variable control signal are provided as a common signal.

17. The multistage amplifier circuit as claimed in claim 16, further comprising an impedance element provided between the gate of the second FET and an input terminal of the second-stage amplifier circuit to which the common signal is applied.

18. A multistage amplifier circuit comprising:

a first-stage amplifier circuit including a first FET of an enhancement type having a gate supplied with an input signal and a gate bias voltage, and a drain via which an amplified output signal is output, and a second FET of the enhancement type having a drain connected to a drain voltage source, a source connected to the drain of the first FET and a gate supplied with a variable control signal for controlling a drain voltage supplied to the first FET;

a second-stage amplifier circuit amplifying an output signal of the first-stage amplifier circuit; and an inductance element connecting the source of the second FET to the drain of the first FET.

19. A multistage amplifier circuit comprising:

a first-stage amplifier circuit amplifying an input signal; and a second-stage amplifier circuit including a first FET of an enhancement type having a source, a gate supplied with an input signal and a gate bias voltage, and a drain via which an amplifier output signal is output, thereby forming a current path directed to the source from the gate, and a second FET of the enhancement type having a drain connected to a gate bias supply source for the first FET, a gate supplied with a variable control signal, and a source via which a source voltage controlled by the variable control signal is output, the source voltage being supplied to the gate of the first FET as the gate bias voltage and a resistance element having a first end connected to the source of the second FET and the gate of the first FET, and a second end grounded.

20. The multistage amplifier circuit as claimed in claim 19, further comprising a capacitance element provided between the first-stage amplifier circuit and the second-stage amplifier circuit.

21. The multistage amplifier as claimed in claim 20, wherein another variable control signal for controlling a gain of the second-stage amplifier circuit is applied to the second-stage amplifier circuit.

22. The multistage amplifier circuit as claimed in claim 21, wherein the variable control signal supplied to the gate of the second FET and said another variable control signal are provided as a common signal.

23. The multistage amplifier circuit as claimed in claim 22, further comprising an impedance element provided between the gate of the second FET and an input terminal of the second-stage amplifier circuit to which the common signal is applied.

24. A multistage amplifier circuit comprising:

a first-stage amplifier circuit including a first FET of an enhancement type having a gate supplied with an input signal and a first gate bias voltage, and a drain via which a first amplified output signal is output, and a second FET of the enhancement type having a drain connected to a first drain voltage source, a source connected to the drain of the first FET and a gate supplied with a first control signal for controlling a first drain voltage supplied to the first FET; and a second-stage amplifier circuit including a third FET of the enhancement type having a source, a gate supplied with the first amplified output signal from the first-stage amplifier circuit an a first gate bias voltage, and a drain via which a second amplified output signal is output, thereby, forming a current path directed to the source from the gate, and a fourth FET of the enhancement type having a drain connected to a second gate bias supply source for the third FET, a gate supplied with a second control signal, and a source via which a source voltage controlled by the second control signal is output, the source voltage being supplied to the gate of the first FET as the first gate bias voltage; and a resistance element having a first end connected to the source of the second FET and the gate of the first FET, and a second end grounded.

25. The multistage amplifier circuit as claimed in claim 24, further comprising a capacitance element provided between the first-stage amplifier circuit and the second-stage amplifier circuit.

26. The multistage amplifier circuit as claimed in claim 24, wherein the first control signal supplied to the gate of the second FET and the second control signal are provided as a common signal.

27. The multistage amplifier circuit as claimed in claim 26, further comprising an impedance element provided between the gate of the second FET and the gate of the fourth FET.

28. The multistage amplifier circuit as claimed in claim 24, further comprising an inductance element connecting the source of the second FET to the drain of the first FET.

29. The multistage amplifier circuit as claimed in claim 28, further comprising a capacitance element grounding the source of the second FET.

30. The multistage amplifier circuit as claimed in claim 24, further comprising a parallel resonance circuit which resonates at a frequency of a signal to be amplified by the first FET, the parallel resonance circuit being connected between the source of the second FET and the drain of the first FET.

31. The amplifier circuit as claimed in claim 1 or claim 13, wherein the first and second FETs are MESFETs.

32. The multistage amplifier circuit as claimed in claim in any of claims 15, 19 and 24, wherein the first through fourth FETs are MESFETS.

33. The amplifier circuit as claimed in claim 1 or claim 13, wherein the first and second FETs are MESFETs using compound semiconductor elements.

34. The multistage amplifier circuit as claimed in any of claims 15, 19 and 24, wherein the first through fourth FETs are MESFETs using compound semiconductor elements.

35. An amplifier circuit comprising:

a first FET of an enhancement type having a gate supplied with an input signal and a gate bias voltage and a drain via which an amplified output signal is output; and a second FET of the enhancement type having a drain connected to a drain voltage source, a source connected to the drain of the first FET, and a gate supplied with a control signal independent from said drain voltage source for controlling the drain voltage supplied to the first FET, wherein the source of the second FET is connected to the drain of the first FET via a parallel resonance circuit which resonates at a frequency of a signal to be amplified by the first FET.

36. The multistage amplifier circuit as claimed in claim 18, further comprising a capacitance element grounding the source of the second FET.

37. A multistage amplifier circuit comprising:

a first-stage amplifier circuit including a first FET of an enhancement type having a gate supplied with an input signal and a gate bias voltage, and a drain via which an amplified output signal is output, and a second FET of the enhancement type having a drain connected to a drain voltage source, a source connected to the drain of the first FET and a gate supplied with a variable control signal for controlling a drain voltage supplied to the first FET;

a second-stage amplifier circuit amplifying an output signal of the first-stage amplifier circuit; and a parallel resonance circuit which resonates at a frequency of a signal to be amplified by the first FET, the parallel resonance circuit being provided between the source of the second FET and the drain of the first FET.

38. An amplifier circuit comprising:

a first FET of an enhancement type having a gate supplied with an input signal and a gate bias voltage and a drain via which an amplified output signal is output; and a second FET of the enhancement type having a drain connected to a drain voltage source, a source connected to the drain of the first FET, and a gate supplied with a control signal independent from said drain voltage source for controlling the drain voltage supplied to the first FET, wherein the first and second FETs are MESFETs, and wherein all of the power supplied to said first and second FETs is from a positive power supply.

39. An amplifier circuit comprising:

a first FET of an enhancement type having a gate supplied with an input signal and a gate bias voltage and a drain via which an amplified output signal is output; and a second FET of the enhancement type having a drain connected to a drain voltage source, a source connected to the drain of the first FET, and a gate supplied with a control signal independent from said drain voltage source for controlling the drain voltage supplied to the first FET, wherein the first and second FETs are MESFETs using compound semiconductor elements, and wherein all of the power supplied to said first and second FETs is from a positive power supply.

40. A multistage amplifier circuit comprising:

a first-stage amplifier circuit including a first FET of an enhancement type having a gate supplied with an input signal and a gate bias voltage, and a drain via which an amplified output signal is output, and a second FET of the enhancement type having a drain connected to a drain voltage source, a source connected to the drain of the first FET and a gate supplied with a variable control signal for controlling a drain voltage supplied to the first FET; and a second-stage amplifier circuit amplifying an output signal of the first-stage amplifier circuit, wherein the first and second FETs are MESFETs, and wherein all of the power supplied to said first and second FETs is from a positive power supply.

41. A multistage amplifier circuit comprising:

a first-stage amplifier circuit including a first FET of an enhancement type having a gate supplied with an input signal and a gate bias voltage, and a drain via which an amplified output signal is output, and a second FET of the enhancement type having a drain connected to a drain voltage source, a source connected to the drain of the first FET and a gate supplied with a variable control signal for controlling a drain voltage supplied to the first FET; and a second-stage amplifier circuit amplifying an output signal of the first-stage amplifier circuit, wherein the first and second FETs are MESFETs using compound semiconductor elements, and wherein all of the power supplied to said first and second FETs is from a positive power supply.

* * * * *